US012626772B2

(12) United States Patent
Berman et al.

(10) Patent No.: US 12,626,772 B2
(45) Date of Patent: May 12, 2026

(54) ENHANCED DE-NOISING FOR RANDOM TELEGRAPH NOISE

(71) Applicant: SAMSUNG ELECTRONICS CO., LTD., Suwon-si (KR)

(72) Inventors: Amit Berman, Binyamina (IL); Jonathan Zedaka, Tel Aviv (IL); Dori Reichmann, Jerusalem (IL); Evgeny Blaichman, Tel Aviv (IL); Karen Michaeli, Tel Aviv (IL); Neria Uzan, Jerusalem (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 161 days.

(21) Appl. No.: 18/733,321

(22) Filed: Jun. 4, 2024

(65) Prior Publication Data

US 2025/0372182 A1     Dec. 4, 2025

(51) Int. Cl.
*G11C 16/34* (2006.01)
*G11C 16/26* (2006.01)
*G11C 16/32* (2006.01)

(52) U.S. Cl.
CPC .......... *G11C 16/3404* (2013.01); *G11C 16/26* (2013.01); *G11C 16/32* (2013.01)

(58) Field of Classification Search
CPC ........................... G11C 16/3404; G11C 16/34
USPC ..................................................... 365/185.14
See application file for complete search history.

(56) References Cited

U.S. PATENT DOCUMENTS

| | | | |
|---|---|---|---|
| 2012/0170378 A1* | 7/2012 | Aritome .............. | G11C 11/5642 365/185.24 |
| 2013/0182510 A1* | 7/2013 | Tanzawa ................ | G11C 16/10 365/185.24 |
| 2020/0294600 A1* | 9/2020 | Shibuya ................. | G11C 16/32 |

* cited by examiner

*Primary Examiner* — Muna A Techane
(74) *Attorney, Agent, or Firm* — Sughrue Mion, PLLC

(57) ABSTRACT

A storage device including: a non-volatile memory comprising a plurality of memory cells, wherein the plurality of memory cells comprises a target memory cell; and a storage controller: wherein the storage controller is configured to: read the target memory cell at a plurality of target read times to obtain a plurality of target voltages, select a threshold model corresponding to the target memory cell from among a plurality of threshold models, and generate data corresponding to the target memory cell by providing the plurality of target voltages to the threshold model.

20 Claims, 17 Drawing Sheets

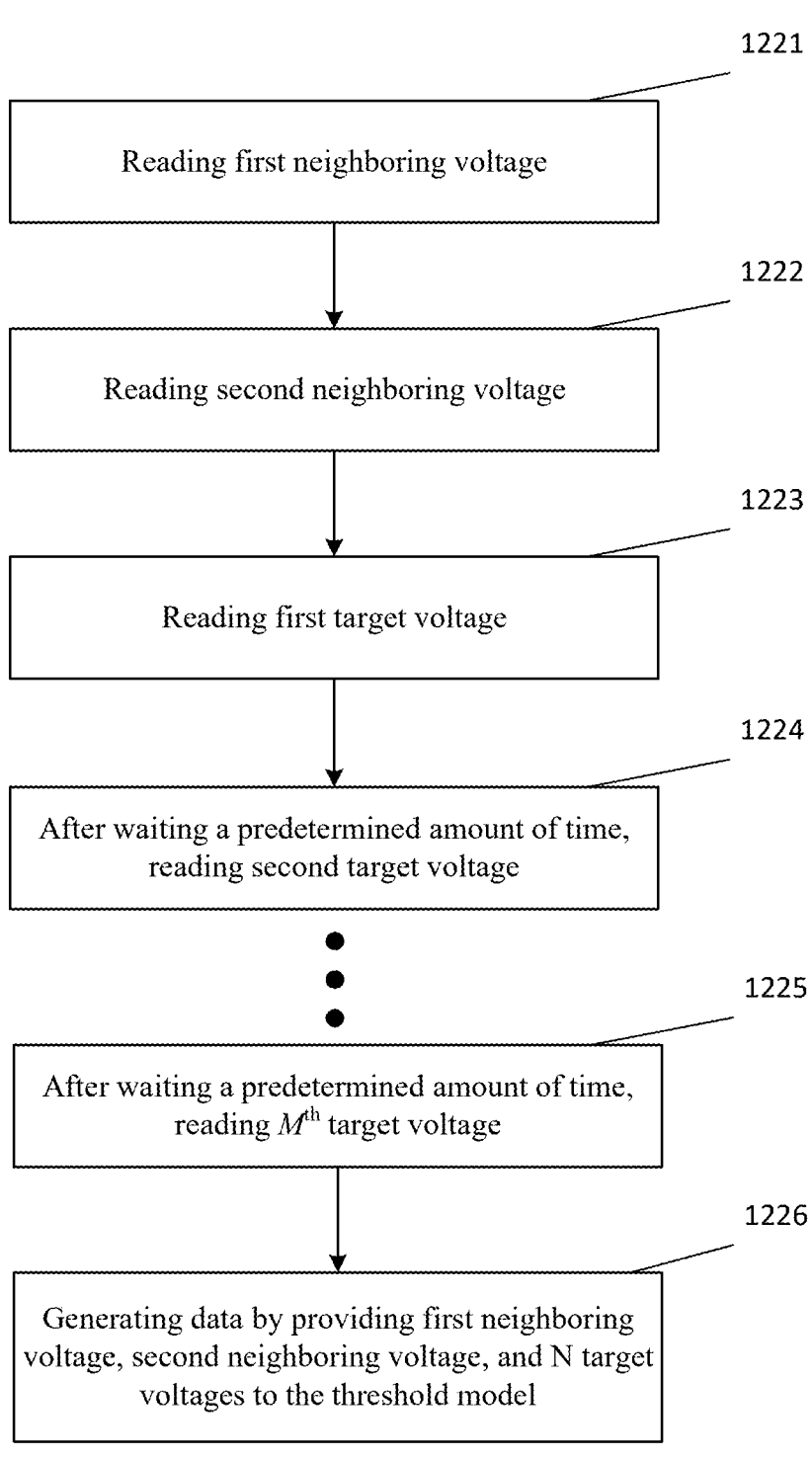

1221

Reading first neighboring voltage

1222

Reading second neighboring voltage

1223

Reading first target voltage

1224

After waiting a predetermined amount of time, reading second target voltage

● ● ●

1225

After waiting a predetermined amount of time, reading $M^{th}$ target voltage

1226

Generating data by providing first neighboring voltage, second neighboring voltage, and N target voltages to the threshold model

ENHANCED DE-NOISING FOR RANDOM TELEGRAPH NOISE

1. FIELD

The present disclosure relates to systems, apparatuses, and methods for performing equalization and de-noising in a storage device, and more particularly to systems, apparatuses, and methods for reducing the effects of read noise and specifically, random telegraph noise.

2. DESCRIPTION OF RELATED ART

Storage devices such as NAND flash memory devices may allow several bits of data to be stored in each memory cell. A memory cell in which multiple bits of data are stored may be referred to as a multi-level memory cell. A multi-level memory cell may partition a voltage range of the memory cell into several voltage states, and data values written to the memory cell may be extracted based on the memory cell voltage levels.

The process of reading the memory cell voltage levels, which may be referred to as threshold voltages, may be impaired by the presence of noise, which may refer to random fluctuations due to multiple physical and electronical mechanisms. Random telegraph noise (RTN), which is an abrupt two-level fluctuation in drain current following trapping and release of a single electron from a channel poly-silicon trap, is one example of noise which may affect reading accuracy of a memory cell. The effect of the RTN may be a bottleneck for NAND flash memory scaling, which also induces read errors and device instabilities.

SUMMARY

Provided are systems, apparatuses, and methods for performing equalization in a storage device, which are capable of reducing the effects of read noise and random telegraph noise.

Additional aspects will be set forth in part in the description which follows and, in part, will be apparent from the description, or may be learned by practice of the presented embodiments.

In accordance with an aspect of the disclosure, a storage device includes a non-volatile memory comprising a plurality of memory cells, wherein the plurality of memory cells comprises a target memory cell; and a storage controller: wherein the storage controller is configured to: read the target memory cell at a plurality of target read times to obtain a plurality of target voltages, select a threshold model corresponding to the target memory cell from among a plurality of threshold models, and generate data corresponding to the target memory cell by providing the plurality of target voltages to the threshold model.

In accordance with an aspect of the disclosure, a storage controller for controlling a storage device includes at least one processor configured to: perform a first target read operation on a target memory cell included in a non-volatile memory to obtain a first target voltage, after waiting a predetermined amount of time after the first target read operation, perform a second target read operation on the target memory cell to obtain a second target voltage, select a threshold model corresponding to the target memory cell from among a plurality of threshold models, and generate data corresponding to the target memory cell by providing the first target voltage and the second target voltage to the threshold model.

In accordance with an aspect of the disclosure, a method of reading data stored in a storage device includes: reading a target memory cell at a plurality of target read times to obtain a plurality of target voltages, wherein the target memory cell is included in a plurality of memory cells included in a non-volatile memory of the storage device, selecting a threshold model corresponding to the target memory cell from among a plurality of threshold models, and generating data corresponding to the target memory cell by providing the plurality of target voltages to the threshold model.

In accordance with an aspect of the disclosure, a method of controlling a storage device includes: performing a first target read operation on a target memory cell included in a non-volatile memory to obtain a first target voltage, after waiting a predetermined amount of time after the first target read operation, performing a second target read operation on the target memory cell to obtain a second target voltage, selecting a threshold model corresponding to the target memory cell from among a plurality of threshold models, and generating data corresponding to the target memory cell by providing the first target voltage and the second target voltage to the threshold model.

BRIEF DESCRIPTION OF DRAWINGS

The above and other aspects, features, and advantages of certain embodiments of the present disclosure will be more apparent from the following description taken in conjunction with the accompanying drawings, in which:

FIGS. 12A-12B are flowcharts of processes for controlling a storage system, according to embodiments.

DETAILED DESCRIPTION

According to at least one example, embodiments of the present disclosure relate to an equalization scheme that may reduce the effects of read noise, for example random telegraph noise (RTN), in a memory read process.

Figure 1:
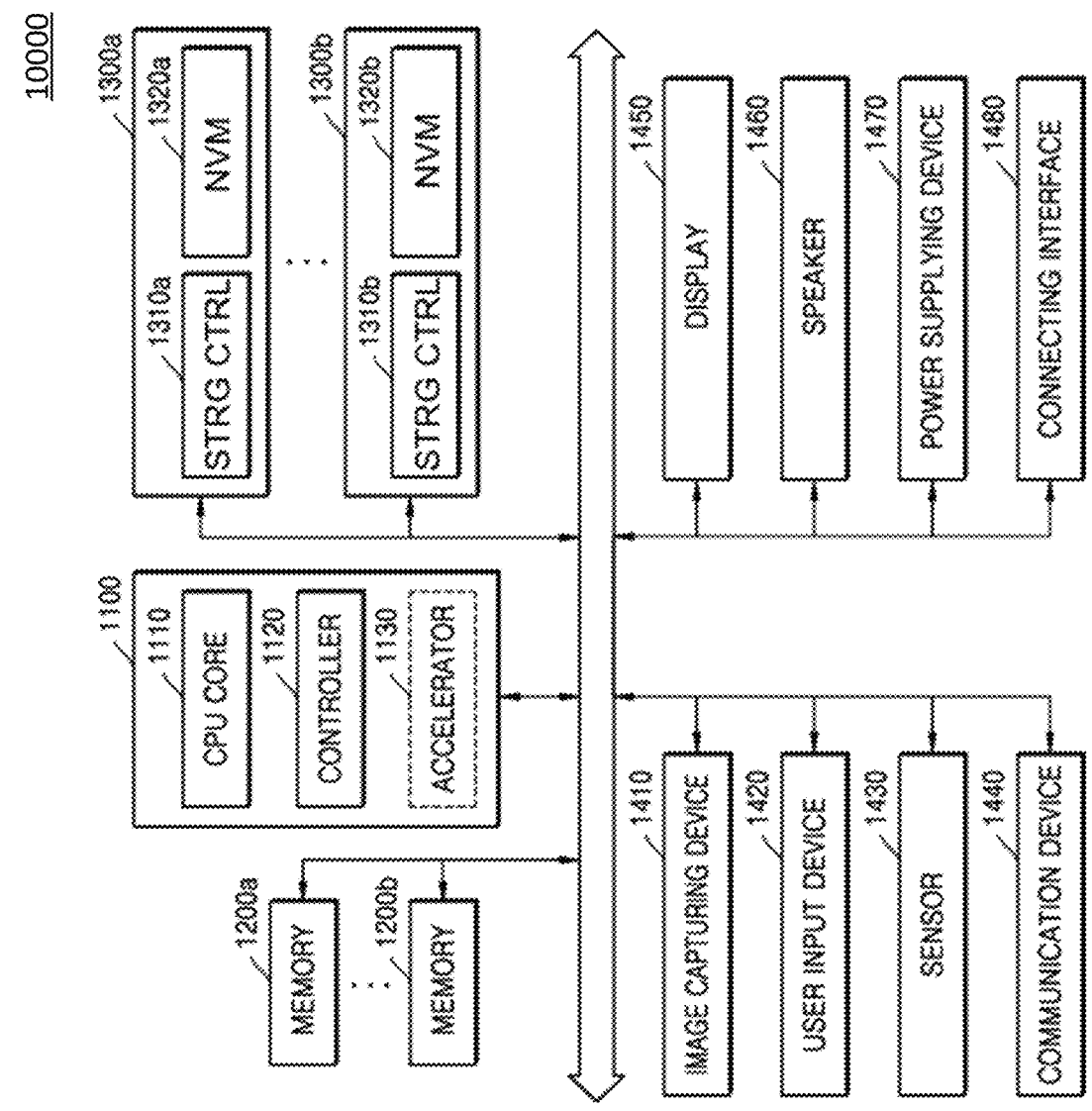
FIG. 1 is a block diagram of a computer system, according to embodiments.

FIG. 1 is a diagram of a system 10000 to which embodiments may be applied. The system 10000 of FIG. 1 may be, for example, a mobile system, such as a portable communication terminal (e.g., a mobile phone), a smartphone, a tablet personal computer (PC), a wearable device, a health-care device, or an Internet of things (IoT) device. However, the system 10000 of FIG. 1 is not necessarily limited to the mobile system and may be a PC, a laptop computer, a server, a media player, or an automotive device (e.g., a navigation device).

Referring to FIG. 1, the system 10000 may include a main processor 1100, memories (e.g., 1200a and 1200b), and storage devices (e.g., 1300a and 1300b). In addition, the system 10000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 10000, more specifically, operations of other components included in the system 10000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 10000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and Non-Volatile Memories (NVMs) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, embodiments are not limited thereto, and the NVMs 1320a and 1320b may include other types of NVMs, such as PRAM and/or RRAM.

The storage devices 1300a and 1300b may be physically separated from the main processor 1100 and included in the system 10000 or implemented in the same package as the main processor 1100. In addition, the storage devices 1300a and 1300b may have types of SSDs or memory cards, and may be removably combined with other components of the system 10000 through an interface, such as the connecting interface 1480 described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 10000 and include a touch pad, a keypad, a keyboard, a mouse, and/or a microphone.

The sensor 1430 may detect various types of physical quantities, which may be obtained from the outside of the system 10000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 10000 according to various communication protocols. The communication device 1440 may include an antenna, a transceiver, and/or a modem.

The display 1450 and the speaker 1460 may serve as output devices configured to respectively output visual information and auditory information to the user of the system 10000.

The power supplying device 1470 may appropriately convert power supplied from a battery embedded in the system 10000 and/or an external power source, and supply the converted power to each of components of the system 10000.

The connecting interface 1480 may provide connection between the system 10000 and an external device, which is connected to the system 10000 and capable of transmitting and receiving data to and from the system 10000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 2:
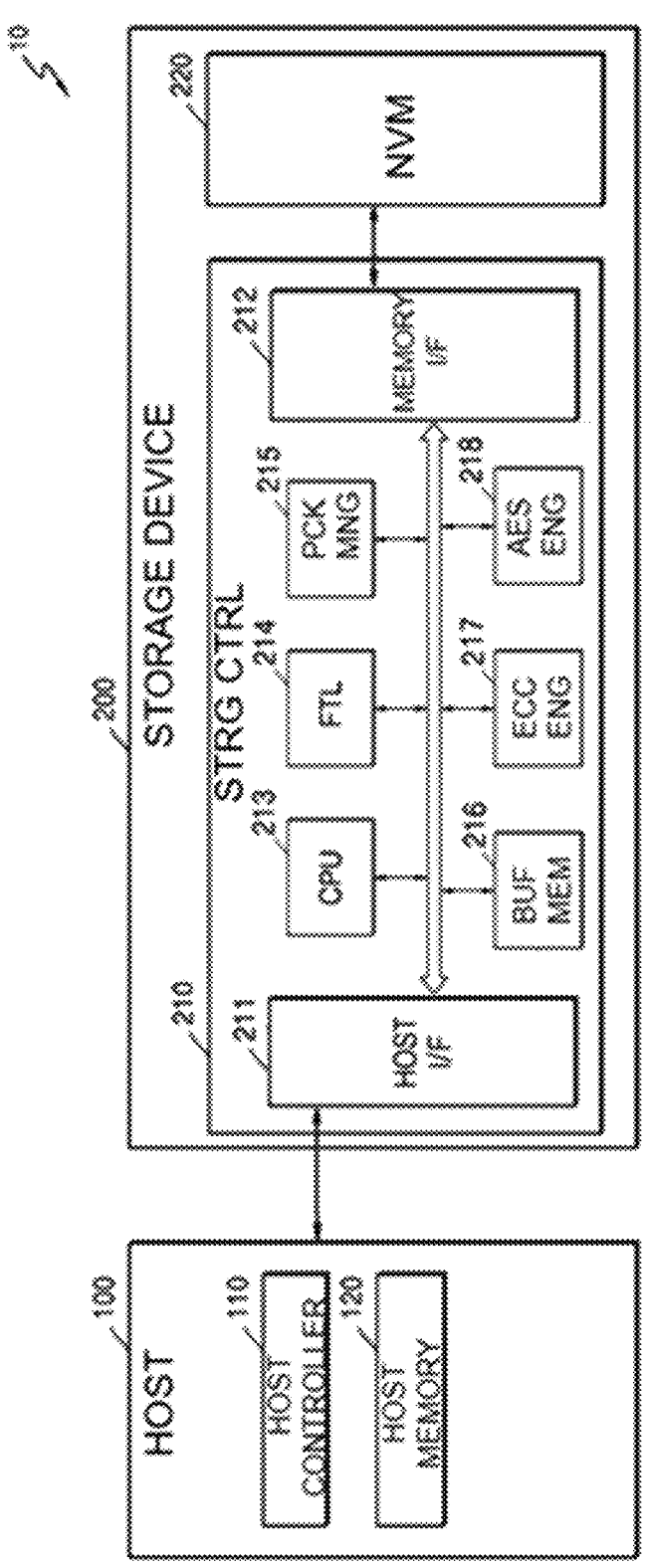
FIG. 2 is a block diagram of a host storage system, according to embodiments.

FIG. 2 is a block diagram of a host storage system 10 according to an example embodiment.

The host storage system 10 may include a host 100 and a storage device 200. Further, the storage device 200 may include a storage controller 210, and an NVM 220. According to an example embodiment, the host 100 may include a host controller 110 and a host memory 120. The host memory 120 may serve as a buffer memory configured to temporarily store data to be transmitted to the storage device 200 or data received from the storage device 200.

The storage device 200 may include storage media configured to store data in response to requests from the host 100. As an example, the storage device 200 may include at least one of an SSD, an embedded memory, and a removable external memory. When the storage device 200 is an SSD, the storage device 200 may be a device that conforms to an NVMe standard. When the storage device 200 is an embedded memory or an external memory, the storage device 200 may be a device that conforms to a UFS standard or an eMMC standard. Each of the host 100 and the storage device 200 may generate a packet according to an adopted standard protocol and transmit the packet.

When the NVM 220 of the storage device 200 includes a flash memory, the flash memory may include a 2D NAND memory array or a 3D (or vertical) NAND (VNAND) memory array. As another example, the storage device 200 may include various other kinds of NVMs. For example, the storage device 200 may include magnetic RAM (MRAM), spin-transfer torque MRAM, conductive bridging RAM (CBRAM), ferroelectric RAM (FRAM), PRAM, RRAM, and various other kinds of memories.

According to an embodiment, the host controller 110 and the host memory 120 may be implemented as separate semiconductor chips. Alternatively, in some embodiments, the host controller 110 and the host memory 120 may be integrated in the same semiconductor chip. As an example, the host controller 110 may be any one of a plurality of modules included in an application processor (AP). The AP may be implemented as a System on Chip (SoC). Further, the host memory 120 may be an embedded memory included in the AP or an NVM or memory module located outside the AP.

The host controller 110 may manage an operation of storing data (e.g., write data) of a buffer region of the host memory 120 in the NVM 220 or an operation of storing data (e.g., read data) of the NVM 220 in the buffer region.

The storage controller 210 may include a host interface 211, a memory interface 212, and a CPU 213. Further, the storage controller 210 may further include a flash translation layer (FTL) 214, a packet manager 215, a buffer memory 216, an error correction code (ECC) engine 217, and an advanced encryption standard (AES) engine 218. The storage controller 210 may further include a working memory in which the FTL 214 is loaded. The CPU 213 may execute the FTL 214 to control data write and read operations on the NVM 220.

The host interface 211 may transmit and receive packets to and from the host 100. A packet transmitted from the host 100 to the host interface 211 may include a command or data to be written to the NVM 220. A packet transmitted from the host interface 211 to the host 100 may include a response to the command or data read from the NVM 220. The memory interface 212 may transmit data to be written to the NVM 220 to the NVM 220 or receive data read from the NVM 220. The memory interface 212 may be configured to comply with a standard protocol, such as Toggle or open NAND flash interface (ONFI).

The FTL 214 may perform various functions, such as an address mapping operation, a wear-leveling operation, and a garbage collection operation. The address mapping operation may be an operation of converting a logical address received from the host 100 into a physical address used to actually store data in the NVM 220. The wear-leveling operation may be a technique for preventing excessive deterioration of a specific block by allowing blocks of the NVM 220 to be uniformly used. As an example, the wear-leveling operation may be implemented using a firmware technique that balances erase counts of physical blocks. The garbage collection operation may be a technique for ensuring usable capacity in the NVM 220 by erasing an existing block after copying valid data of the existing block to a new block.

The packet manager 215 may generate a packet according to a protocol of an interface, which consents to the host 100, or parse various types of information from the packet received from the host 100. In addition, the buffer memory 216 may temporarily store data to be written to the NVM 220 or data to be read from the NVM 220. Although the buffer memory 216 may be a component included in the storage controller 210, the buffer memory 216 may be outside the storage controller 210.

The ECC engine 217 may perform error detection and correction operations on read data read from the NVM 220. More specifically, the ECC engine 217 may generate parity bits for write data to be written to the NVM 220, and the generated parity bits may be stored in the NVM 220 together with write data. During the reading of data from the NVM 220, the ECC engine 217 may correct an error in the read data by using the parity bits read from the NVM 220 along with the read data, and output error-corrected read data.

The AES engine 218 may perform at least one of an encryption operation and a decryption operation on data input to the storage controller 210 by using a symmetric-key algorithm.

Figure 3:
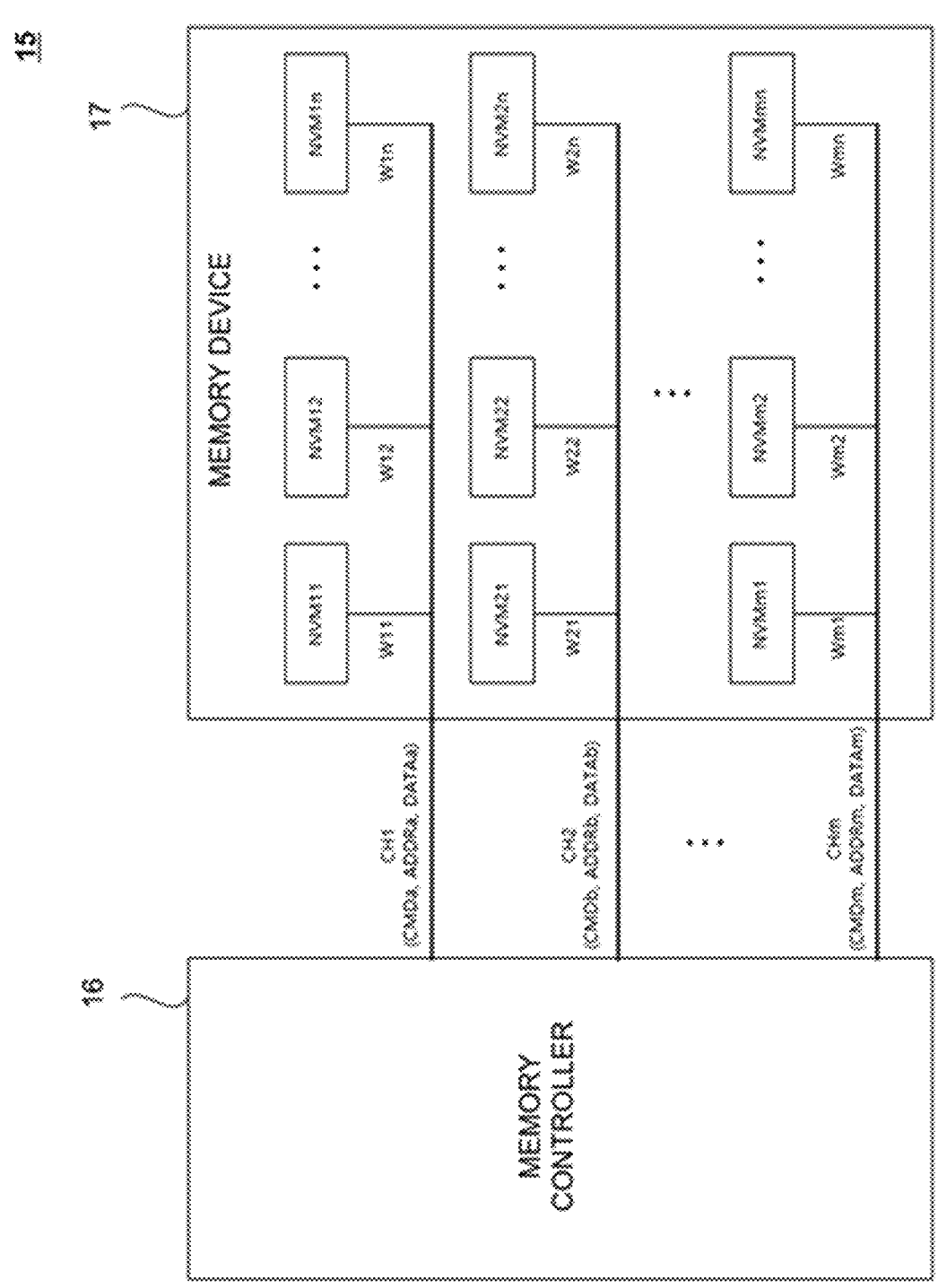
FIG. 3 is a block diagram of a memory system, according to embodiments.

FIG. 3 is a block diagram of a memory system 15 according embodiments. Referring to FIG. 3, the memory system 15 may include a memory device 17 and a memory controller 16. The memory system 15 may support a plurality of channels CH1 to CHm, and the memory device 17 may be connected to the memory controller 16 through the plurality of channels CH1 to CHm. For example, the memory system 15 may be implemented as a storage device, such as an SSD.

The memory device 17 may include a plurality of NVM devices NVM11 to NVMmn. Each of the NVM devices NVM11 to NVMmn may be connected to one of the plurality of channels CH1 to CHm through a way corresponding thereto. For instance, the NVM devices NVM11 to NVM1n may be connected to a first channel CH1 through ways W11 to W1$n$, and the NVM devices NVM21 to NVM2$n$ may be connected to a second channel CH2 through ways W21 to W2$n$. In an example embodiment, each of the NVM devices NVM11 to NVMmn may be implemented as an arbitrary memory unit that may operate according to an individual command from the memory controller 16. For example, each of the NVM devices NVM11 to NVMmn may be implemented as a chip or a die, but the embodiments of the disclosure are not limited thereto.

The memory controller 16 may transmit and receive signals to and from the memory device 17 through the plurality of channels CH1 to CHm. For example, the memory controller 16 may transmit commands CMDa to CMDm, addresses ADDRa to ADDRm, and data DATAa to DATAm to the memory device 17 through the channels CH1 to CHm or receive the data DATAa to DATAm from the memory device 17.

The memory controller 16 may select one of the NVM devices NVM11 to NVMmn, which is connected to each of the channels CH1 to CHm, by using a corresponding one of the channels CH1 to CHm, and transmit and receive signals to and from the selected NVM device. For example, the memory controller 16 may select the NVM device NVM11 from the NVM devices NVM11 to NVM1$n$ connected to the first channel CH1. The memory controller 16 may transmit the command CMDa, the address ADDRa, and the data DATAa to the selected NVM device NVM11 through the first channel CH1 or receive the data DATAa from the selected NVM device NVM11.

The memory controller 16 may transmit and receive signals to and from the memory device 17 in parallel through different channels. For example, the memory controller 16 may transmit a command CMDb to the memory device 17 through the second channel CH2 while transmitting a command CMDa to the memory device 17 through the first channel CH1. For example, the memory controller 16 may receive data DATAb from the memory device 17 through the second channel CH2 while receiving data DATAa from the memory device 17 through the first channel CH1.

The memory controller 16 may control all operations of the memory device 17. The memory controller 16 may transmit a signal to the channels CH1 to CHm and control each of the NVM devices NVM11 to NVMmn connected to the channels CH1 to CHm. For instance, the memory controller 16 may transmit the command CMDa and the address ADDRa to the first channel CH1 and control one selected from the NVM devices NVM11 to NVMln.

Each of the NVM devices NVM11 to NVMmn may operate via the control of the memory controller 16. For example, the NVM device NVM11 may program the data DATAa based on the command CMDa, the address ADDRa, and the data DATAa provided to the first channel CH1. For example, the NVM device NVM21 may read the data DATAb based on the command CMDb and the address ADDb provided to the second channel CH2 and transmit the read data DATAb to the memory controller 16.

Although FIG. 3 illustrates an example in which the memory device 17 communicates with the memory controller 16 through m channels and includes n NVM devices corresponding to each of the channels, the number of channels and the number of NVM devices connected to one channel may be variously changed.

Figure 4:
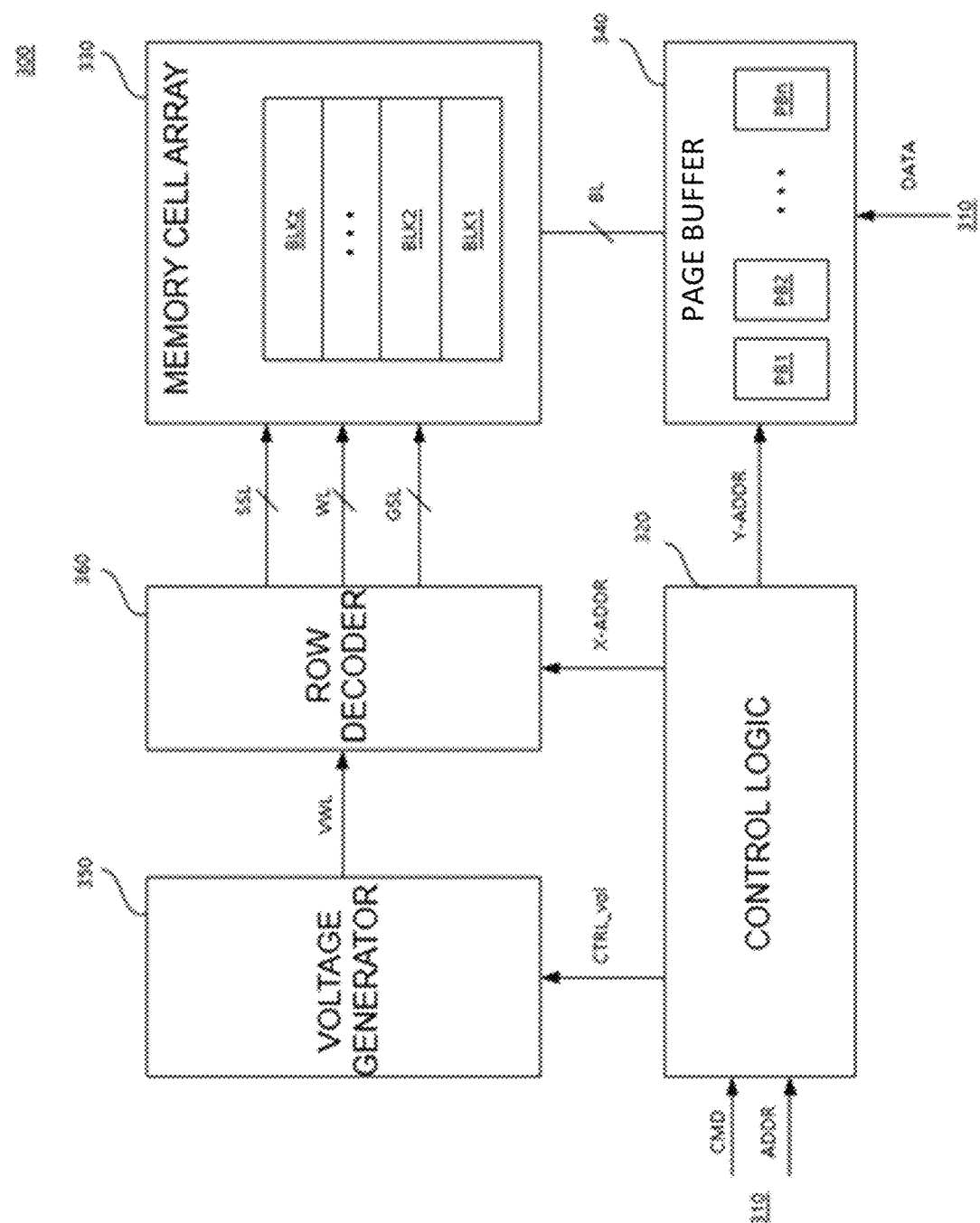
FIG. 4 is a block diagram of a memory device, according to embodiments.

FIG. 4 is a block diagram of a memory device 300 according to an example embodiment. Referring to FIG. 4, the memory device 300 may include a control logic circuitry 320, a memory cell array 330, a page buffer 340, a voltage generator 350, and a row decoder 360. The memory device 300 may further include a memory interface circuitry 310 shown in FIG. 6. In addition, the memory device 300 may further include a column logic, a pre-decoder, a temperature sensor, a command decoder, and/or an address decoder.

The control logic circuitry 320 may control all various operations of the memory device 300. The control logic circuitry 320 may output various control signals in response to commands CMD and/or addresses ADDR from the memory interface circuitry 310. For example, the control logic circuitry 320 may output a voltage control signal CTRL_vol, a row address X-ADDR, and a column address Y-ADDR.

The memory cell array 330 may include a plurality of memory blocks BLK1 to BLKz (here, z is a positive integer), each of which may include a plurality of memory cells. The memory cell array 330 may be connected to the page buffer 340 through bit lines BL and be connected to the row decoder 360 through word lines WL, string selection lines SSL, and ground selection lines GSL.

In an example embodiment, the memory cell array 330 may include a 3D memory cell array, which includes a plurality of NAND strings. Each of the NAND strings may include memory cells respectively connected to word lines vertically stacked on a substrate. The disclosures of U.S. Pat. Nos. 7,679,133; 8,553,466; 8,654,587; 8,559,235; and US Pat. Pub. No. 2011/0233648 are hereby incorporated by reference. In an example embodiment, the memory cell array 330 may include a 2D memory cell array, which includes a plurality of NAND strings arranged in a row direction and a column direction.

The page buffer 340 may include a plurality of page buffers PB1 to PBn (here, n is an integer greater than or equal to 3), which may be respectively connected to the memory cells through a plurality of bit lines BL. The page buffer 340 may select at least one of the bit lines BL in response to the column address Y-ADDR. The page buffer 340 may operate as a write driver or a sense amplifier according to an operation mode. For example, during a program operation, the page buffer 340 may apply a bit line voltage corresponding to data to be programmed, to the selected bit line. During a read operation, the page buffer 340 may sense current or a voltage of the selected bit line BL and sense data stored in the memory cell.

The voltage generator 350 may generate various kinds of voltages for program, read, and erase operations based on the voltage control signal CTRL_vol. For example, the voltage generator 350 may generate a program voltage, a read voltage, a program verification voltage, and an erase voltage as a word line voltage VWL.

The row decoder 360 may select one of a plurality of word lines WL and select one of a plurality of string selection lines SSL in response to the row address X-ADDR. For example, the row decoder 360 may apply the program voltage and the program verification voltage to the selected word line WL during a program operation and apply the read voltage to the selected word line WL during a read operation.

Figure 5:
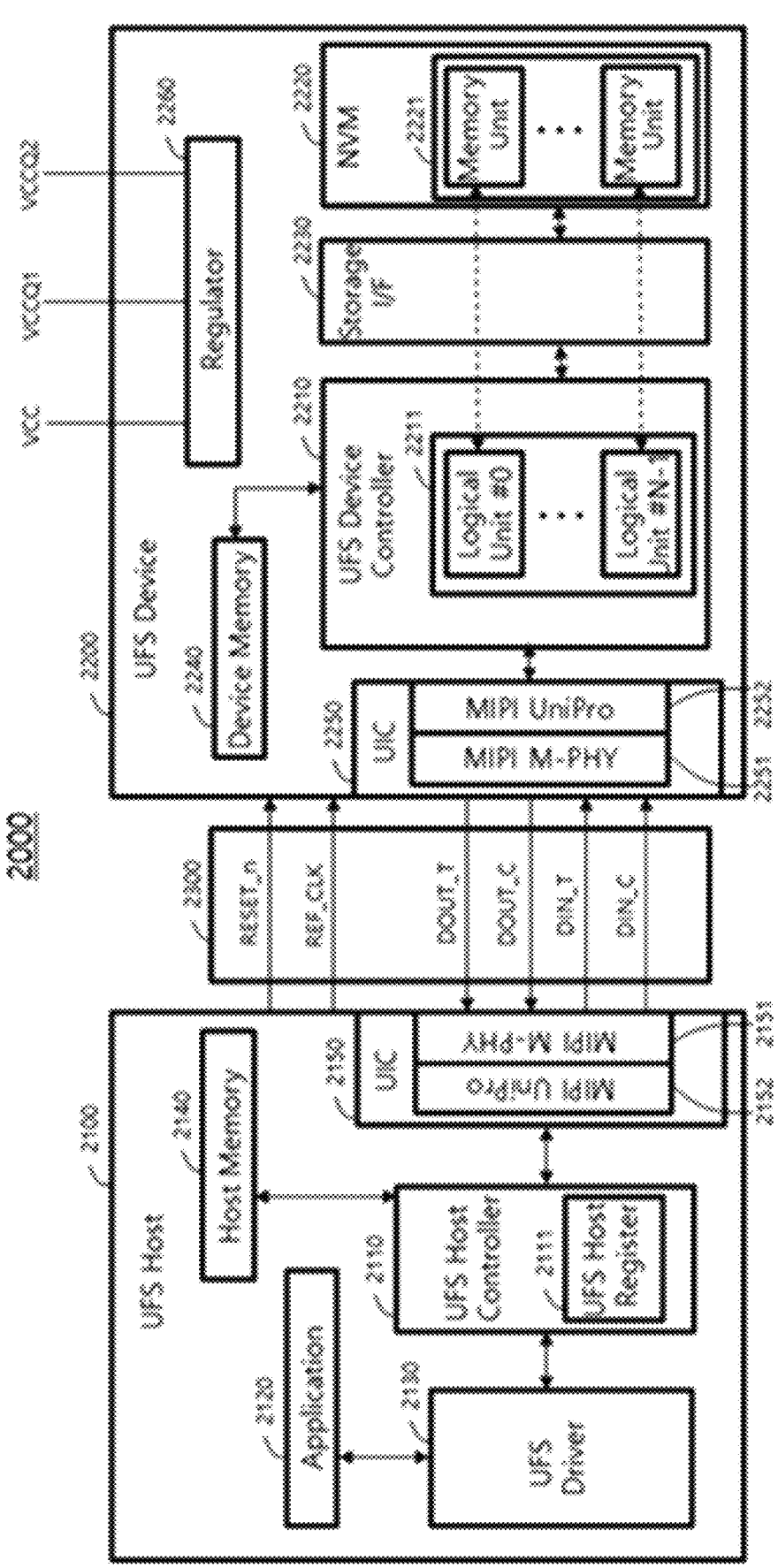
FIG. 5 is a block diagram of a UFS system, according to embodiments.

FIG. 5 is a diagram of a UFS system 2000 according to embodiments. The UFS system 2000 may be a system conforming to a UFS standard announced by Joint Electron Device Engineering Council (JEDEC) and include a UFS host 2100, a UFS device 2200, and a UFS interface 2300. The above description of the system 10000 of FIG. 1 may also be applied to the UFS system 2000 of FIG. 5 within a range that does not conflict with the following description of FIG. 5.

Referring to FIG. 5, the UFS host 2100 may be connected to the UFS device 2200 through the UFS interface 2300. When the main processor 1100 of FIG. 1 is an AP, the UFS host 2100 may be implemented as a portion of the AP. The UFS host controller 2110 and the host memory 2140 may respectively correspond to the controller 1120 of the main processor 1100 and the memories 1200a and 1200b of FIG. 1. The UFS device 2200 may correspond to the storage device 1300a and 1300b of FIG. 1, and a UFS device controller 2210 and an NVM 2220 may respectively correspond to the storage controllers 1310a and 1310b and the NVMs 1320a and 1320b of FIG. 1.

The UFS host 2100 may include a UFS host controller 2110, an application 2120, a UFS driver 2130, a host memory 2140, and a UFS interconnect (UIC) layer 2150. The UFS device 2200 may include the UFS device controller 2210, the NVM 2220, a storage interface 2230, a device memory 2240, a UIC layer 2250, and a regulator 2260. The NVM 2220 may include a plurality of memory units 2221. Although each of the memory units 2221 may include a V-NAND flash memory having a 2D structure or a 3D structure, each of the memory units 2221 may include another kind of NVM, such as PRAM and/or RRAM. The UFS device controller 2210 may be connected to the NVM 2220 through the storage interface 2230. The storage interface 2230 may be configured to comply with a standard protocol, such as Toggle or ONFI.

The application 2120 may refer to a program that wants to communicate with the UFS device 2200 to use functions of the UFS device 2200. The application 2120 may transmit input-output requests (IORs) to the UFS driver 2130 for input/output (I/O) operations on the UFS device 2200. The IORs may refer to a data read request, a data storage (or write) request, and/or a data erase (or discard) request, without being limited thereto.

The UFS driver 2130 may manage the UFS host controller 2110 through a UFS-host controller interface (UFS-HCI). The UFS driver 2130 may convert the IOR generated by the application 2120 into a UFS command defined by the UFS standard and transmit the UFS command to the UFS host controller 2110. One IOR may be converted into a plurality of UFS commands. Although the UFS command may basically be defined by an SCSI standard, the UFS command may be a command dedicated to the UFS standard.

The UFS host controller 2110 may transmit the UFS command converted by the UFS driver 2130 to the UIC layer 2250 of the UFS device 2200 through the UIC layer 2150 and the UFS interface 2300. During the transmission of the UFS command, a UFS host register 2111 of the UFS host controller 2110 may serve as a command queue (CQ).

The UIC layer 2150 on the side of the UFS host 2100 may include a mobile industry processor interface (MIPI) M-PHY 2151 and an MIPI UniPro 2152, and the UIC layer 2250 on the side of the UFS device 2200 may also include an MIPI M-PHY 2251 and an MIPI UniPro 2252.

The UFS interface 2300 may include a line configured to transmit a reference clock signal REF_CLK, a line configured to transmit a hardware reset signal RESET_n for the UFS device 2200, a pair of lines configured to transmit a pair of differential input signals DIN_t and DIN_c, and a pair of lines configured to transmit a pair of differential output signals DOUT_t and DOUT_c.

A frequency of a reference clock signal REF_CLK provided from the UFS host 2100 to the UFS device 2200 may be one of 19.2 MHz, 26 MHz, 38.4 MHz, and 52 MHz, without being limited thereto. The UFS host 2100 may change the frequency of the reference clock signal REF_CLK during an operation, that is, during data transmission/receiving operations between the UFS host 2100 and the UFS device 2200. The UFS device 2200 may generate cock signals having various frequencies from the reference clock signal REF_CLK provided from the UFS host 2100, by using a phase-locked loop (PLL). Also, the UFS host 2100 may set a data rate between the UFS host 2100 and the UFS device 2200 by using the frequency of the reference clock signal REF_CLK. That is, the data rate may be determined depending on the frequency of the reference clock signal REF_CLK.

The UFS interface 2300 may support a plurality of lanes, each of which may be implemented as a pair of differential lines. For example, the UFS interface 2300 may include at least one receiving lane and at least one transmission lane. In FIG. 5, a pair of lines configured to transmit a pair of differential input signals DIN_T and DIN_C may constitute a receiving lane, and a pair of lines configured to transmit a pair of differential output signals DOUT_T and DOUT_C may constitute a transmission lane. Although one transmission lane and one receiving lane are illustrated in FIG. 5, the number of transmission lanes and the number of receiving lanes may be changed.

The receiving lane and the transmission lane may transmit data based on a serial communication scheme. Full-duplex communications between the UFS host 2100 and the UFS device 2200 may be enabled due to a structure in which the receiving lane is separated from the transmission lane. That is, while receiving data from the UFS host 2100 through the receiving lane, the UFS device 2200 may transmit data to the UFS host 2100 through the transmission lane. In addition, control data (e.g., a command) from the UFS host 2100 to the UFS device 2200 and user data to be stored in or read from the NVM 2220 of the UFS device 2200 by the UFS host 2100 may be transmitted through the same lane. Accordingly, between the UFS host 2100 and the UFS device 2200, there may be no need to further provide a separate lane for data transmission in addition to a pair of receiving lanes and a pair of transmission lanes.

The UFS device controller 2210 of the UFS device 2200 may control all operations of the UFS device 2200. The UFS device controller 2210 may manage the NVM 2220 by using a logical unit (LU) 2211, which is a logical data storage unit. The number of LUs 2211 may be 8, without being limited thereto. The UFS device controller 2210 may include an FTL and convert a logical data address (e.g., a logical block address (LBA)) received from the UFS host 2100 into a physical data address (e.g., a physical block address (PBA)) by using address mapping information of the FTL. A logical block configured to store user data in the UFS system 2000 may have a size in a predetermined range. For example, a minimum size of the logical block may be set to 4 Kbyte.

When a command from the UFS host 2100 is applied through the UIC layer 2250 to the UFS device 2200, the UFS device controller 2210 may perform an operation in response to the command and transmit a completion response to the UFS host 2100 when the operation is completed.

As an example, when the UFS host 2100 intends to store user data in the UFS device 2200, the UFS host 2100 may transmit a data storage command to the UFS device 2200. When a response (a 'ready-to-transfer' response) indicating that the UFS host 2100 is ready to receive user data (ready-to-transfer) is received from the UFS device 2200, the UFS host 2100 may transmit user data to the UFS device 2200. The UFS device controller 2210 may temporarily store the received user data in the device memory 2240 and store the user data, which is temporarily stored in the device memory 2240, at a selected position of the NVM 2220 based on the address mapping information of the FTL.

As another example, when the UFS host 2100 intends to read the user data stored in the UFS device 2200, the UFS host 2100 may transmit a data read command to the UFS device 2200. The UFS device controller 2210, which has received the command, may read the user data from the NVM 2220 based on the data read command and temporarily store the read user data in the device memory 2240. During the read operation, the UFS device controller 2210 may detect and correct an error in the read user data by using an ECC engine embedded therein. More specifically, the ECC engine may generate parity bits for write data to be written to the NVM 2220, and the generated parity bits may be stored in the NVM 2220 along with the write data. During the reading of data from the NVM 2220, the ECC engine may correct an error in read data by using the parity bits read from the NVM 2220 along with the read data, and output error-corrected read data.

In addition, the UFS device controller 2210 may transmit user data, which is temporarily stored in the device memory 2240, to the UFS host 2100. In addition, the UFS device controller 2210 may further include an AES engine. The AES engine may perform at least of an encryption operation and a decryption operation on data transmitted to the UFS device controller 2210 by using a symmetric-key algorithm.

The UFS host 2100 may sequentially store commands, which are to be transmitted to the UFS device 2200, in the UFS host register 2111, which may serve as a common queue, and sequentially transmit the commands to the UFS device 2200. In this case, even while a previously transmitted command is still being processed by the UFS device 2200, that is, even before receiving a notification that the previously transmitted command has been processed by the UFS device 2200, the UFS host 2100 may transmit a next command, which is on standby in the CQ, to the UFS device 2200. Thus, the UFS device 2200 may also receive a next command from the UFS host 2100 during the processing of the previously transmitted command. A maximum number (or queue depth) of commands that may be stored in the CQ may be, for example, 32. Also, the CQ may be implemented as a circular queue in which a start and an end of a command line stored in a queue are indicated by a head pointer and a tail pointer.

Each of the plurality of memory units 2221 may include a memory cell array and a control circuit configured to control an operation of the memory cell array. The memory cell array may include a 2D memory cell array or a 3D memory cell array. The memory cell array may include a plurality of memory cells. Although each of the memory cells is a single-level cell (SLC) configured to store 1-bit information, each of the memory cells may be a cell configured to store information of 2 bits or more, such as a multi-level cell (MLC), a triple-level cell (TLC), and a quadruple-level cell (QLC). The 3D memory cell array may include a vertical NAND string in which at least one memory cell is vertically oriented and located on another memory cell.

Voltages VCC, VCCQ, and VCCQ2 may be applied as power supply voltages to the UFS device 2200. The voltage VCC may be a main power supply voltage for the UFS device 2200 and be in a range of 2.4 V to 3.6 V. The voltage VCCQ may be a power supply voltage for supplying a low voltage mainly to the UFS device controller 2210 and be in a range of 1.14 V to 1.26 V. The voltage VCCQ2 may be a power supply voltage for supplying a voltage, which is lower than the voltage VCC and higher than the voltage VCCQ, mainly to an I/O interface, such as the MIPI M-PHY 2251, and be in a range of 1.7 V to 1.95 V. The power supply voltages may be supplied through the regulator 2260 to respective components of the UFS device 2200. The regulator 2260 may be implemented as a set of unit regulators respectively connected to different ones of the power supply voltages described above.

As discussed above, embodiments may relate to efficient BCH decoding with low error correcting capability, which may correct t and (t+1) errors in polar codewords. As discussed above, an error correcting capability of t=2 may be used, however embodiments are not limited thereto. In embodiments, at least some polar codewords from among a plurality of polar codewords, which may be stored for example in a storage device, may be decoded using BCH decoders and not polar decoders, and therefore an overall throughput may be increased. In some embodiments, one or more polar parity may be used for checking or validating the polar frames, and for performing smart chase decoding, examples of which are discussed in greater detail below.

Figure 6A:
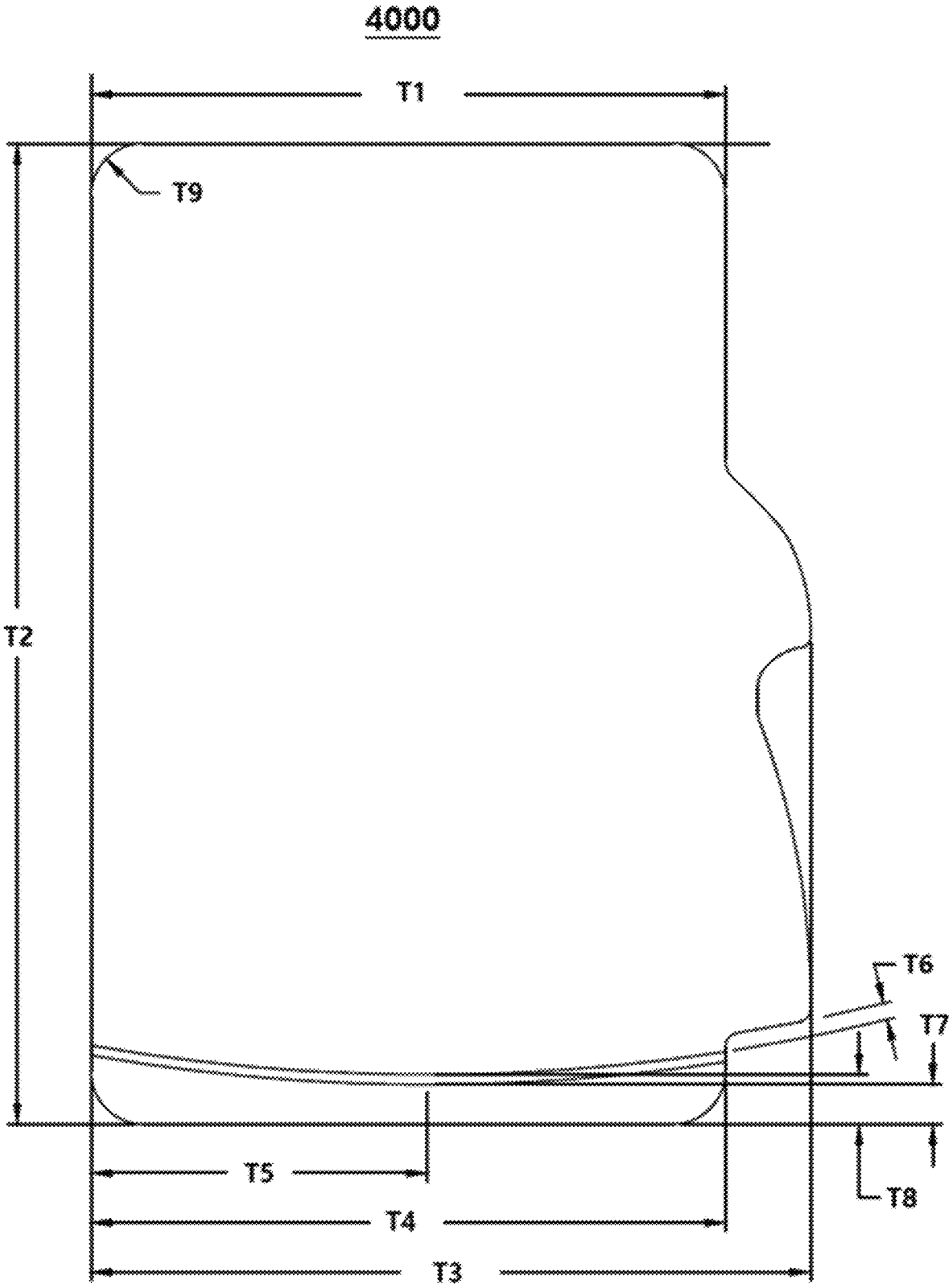
FIGS. 6A to 6C are diagrams of a form factor of a UFS card, according to embodiments.
Figure 6B:
Figure 6B:
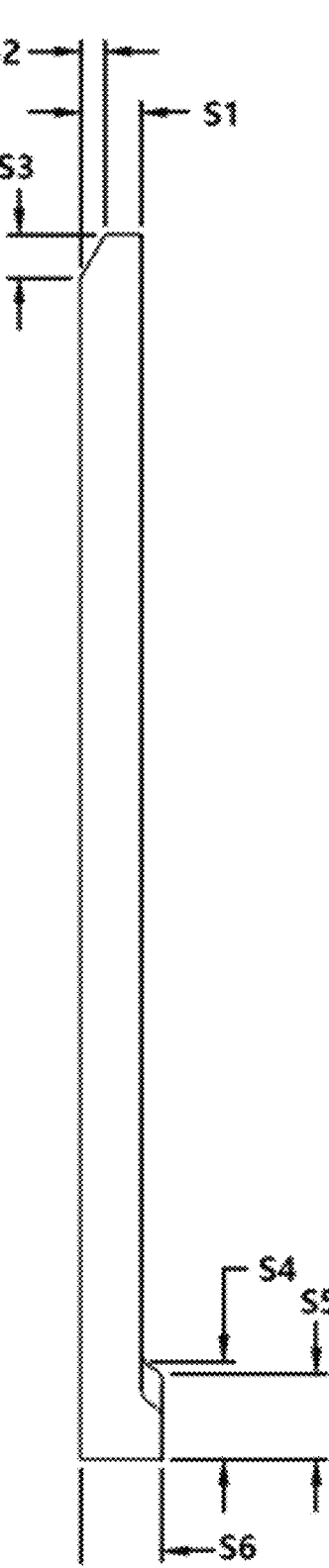
Figure 6C:
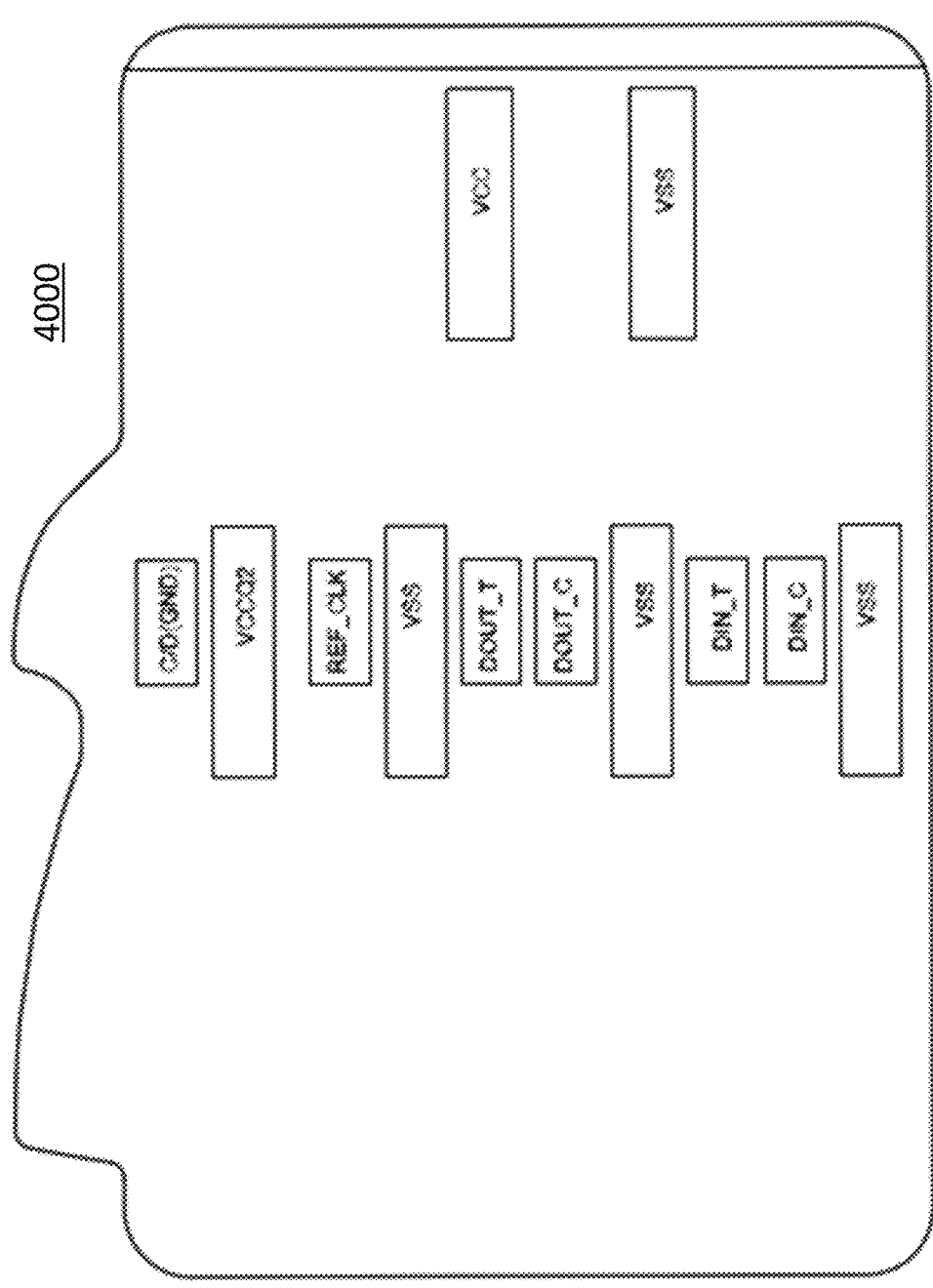

FIGS. 6A to 6C are diagrams of a form factor of a UFS card 4000. When the UFS device 2200 described with reference to FIG. 5 is implemented as the UFS card 4000, an outer appearance of the UFS card 4000 may be as shown in FIGS. 6A to 6C.

FIG. 6A is a top view of the UFS card 4000, according to an example embodiment. Referring to FIG. 6A, it can be seen that the UFS card 4000 entirely follows a shark-shaped design. In FIG. 6A, the UFS card 4000 may have dimensions shown in Table 1 below as an example.

TABLE 1

| Item | Dimension (mm) |
|---|---|
| T1 | 9.70 |
| T2 | 15.00 |
| T3 | 11.00 |
| T4 | 9.70 |
| T5 | 5.15 |

TABLE 1-continued

| Item | Dimension (mm) |
|---|---|
| T6 | 0.25 |
| T7 | 0.60 |
| T8 | 0.75 |
| T9 | R0.80 |

FIG. 6B is a side view of the UFS card 4000, according to an example embodiment. In FIG. 6B, the UFS card 4000 may have dimensions shown in Table 2 below as an example.

TABLE 2

| Item | Dimension (mm) |
|---|---|
| S1 | 0.74 ± 0.06 |
| S2 | 0.30 |
| S3 | 0.52 |
| S4 | 1.20 |
| S5 | 1.05 |
| S6 | 1.00 |

FIG. 6C is a bottom view of the UFS card 4000, according to an example embodiment. Referring to FIG. 6C, a plurality of pins for electrical contact with a UFS slot may be formed on a bottom surface of the UFS card 4000. Functions of each of the pins will be described below. Based on symmetry between a top surface and the bottom surface of the UFS card 4000, some pieces (e.g., T1 to T5 and T9) of information about the dimensions described with reference to FIG. 6A and Table 1 may also be applied to the bottom view of the UFS card 4000, which is shown in FIG. 6C.

A plurality of pins for an electrical connection with a UFS host may be formed on the bottom surface of the UFS card 4000. Referring to FIG. 6C, a total number of pins may be 12. Each of the pins may have a rectangular shape, and signal names corresponding to the pins may be as shown in FIG. 6C. Specific information about each of the pins will be understood with reference to Table 3 below and the above description presented with reference to FIG. 5.

TABLE 3

| No. | Signal Name | Description | Dimension (mm) |
|---|---|---|---|
| 1 | Vss | Ground (GND) | 3.00 × 0.72 ± 0.05 |
| 2 | DIN_C | Differential input signals | 1.50 × 0.72 ± 0.05 |
| 3 | DIN_T | input from a host to the UFS card 4000 (DIN_C is a negative node, and DIN_T is a positive node) | |
| 4 | Vss | Ground (GND) | 3.00 × 0.72 ± 0.05 |
| 5 | DOUT_C | Differential output signals | 1.50 × 0.72 ± 0.05 |
| 6 | DOUT_T | output from the UFS card 4000 to the host (DOUT_C is a negative node, and DOUT_T is a positive node) | |
| 7 | Vss | Ground (GND) | 3.00 × 0.72 ± 0.05 |
| 8 | REF_CLK | Reference clock signal provided from the host to the UFS card 4000 | 1.50 × 0.72 ± 0.05 |
| 9 | VCCQ2 | Power supply voltage provided mainly to a PHY interface or a controller and having a lower value than voltage Vcc | 3.00 × 0.72 ± 0.05 |
| 10 | C/D(GND) | Card detection signal | 1.50 × 0.72 ± 0.05 |
| 11 | Vss | Ground (GND) | 3.00 × 0.80 ± 0.05 |
| 12 | Vcc | Main power supply voltage | |

Figure 7:
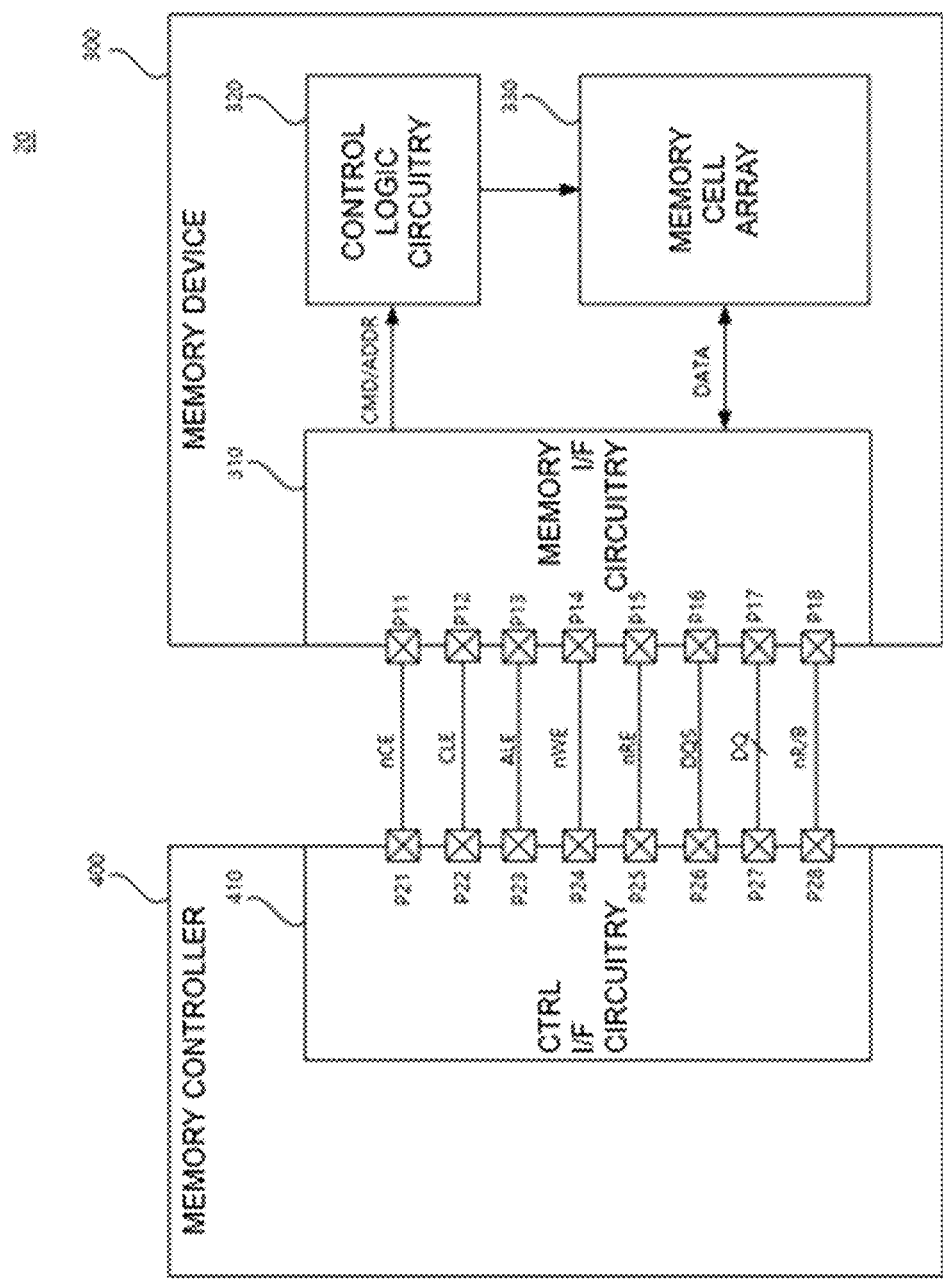
FIG. 7 is a block diagram of a memory system according to embodiments.

FIG. 7 is a block diagram of a memory system 20 according to an embodiment. Referring to FIG. 7, the memory system 20 may include a memory device 300 and a memory controller 400. The memory device 300 may correspond to one of NVM devices NVM11 to NVMmn, which communicate with a memory controller 400 based on one of the plurality of channels CH1 to CHm of FIG. 3. The memory controller 400 may correspond to the storage controller 210 of FIG. 3.

The memory device 300 may include first to eighth pins P11 to P18, a memory interface circuitry 310, a control logic circuitry 320, and a memory cell array 330.

The memory interface circuitry 310 may receive a chip enable signal nCE from the memory controller 400 through the first pin P11. The memory interface circuitry 310 may transmit and receive signals to and from the memory controller 400 through the second to eighth pins P12 to P18 in response to the chip enable signal nCE. For example, when the chip enable signal nCE is in an enable state (e.g., a low level), the memory interface circuitry 310 may transmit and receive signals to and from the memory controller 400 through the second to eighth pins P12 to P18.

The memory interface circuitry 310 may receive a command latch enable signal CLE, an address latch enable signal ALE, and a write enable signal nWE from the memory controller 400 through the second to fourth pins P12 to P14. The memory interface circuitry 310 may receive a data signal DQ from the memory controller 400 through the seventh pin P17 or transmit the data signal DQ to the memory controller 400. A command CMD, an address ADDR, and data may be transmitted via the data signal DQ. For example, the data signal DQ may be transmitted through a plurality of data signal lines. In this case, the seventh pin P17 may include a plurality of pins respectively corresponding to a plurality of data signals DQ(s).

The memory interface circuitry 310 may obtain the command CMD from the data signal DQ, which is received in an enable section (e.g., a high-level state) of the command latch enable signal CLE based on toggle time points of the write enable signal nWE. The memory interface circuitry 310 may obtain the address ADDR from the data signal DQ, which is received in an enable section (e.g., a high-level state) of the address latch enable signal ALE based on the toggle time points of the write enable signal nWE.

In an example embodiment, the write enable signal nWE may be maintained at a static state (e.g., a high level or a low level) and toggle between the high level and the low level. For example, the write enable signal nWE may toggle in a section in which the command CMD or the address ADDR is transmitted. Thus, the memory interface circuitry 310 may obtain the command CMD or the address ADDR based on toggle time points of the write enable signal nWE.

The memory interface circuitry 310 may receive a read enable signal nRE from the memory controller 400 through the fifth pin P15. The memory interface circuitry 310 may receive a data strobe signal DQS from the memory controller 400 through the sixth pin P16 or transmit the data strobe signal DQS to the memory controller 400.

In a data (DATA) output operation of the memory device 300, the memory interface circuitry 310 may receive the read enable signal nRE, which toggles through the fifth pin P15, before outputting the data DATA. The memory interface circuitry 310 may generate the data strobe signal DQS, which toggles based on the toggling of the read enable signal nRE. For example, the memory interface circuitry 310 may generate a data strobe signal DQS, which starts toggling after a predetermined delay (e.g., tDQSRE), based on a toggling start time of the read enable signal nRE. The memory interface circuitry 310 may transmit the data signal DQ including the data DATA based on a toggle time point of the data strobe signal DQS. Thus, the data DATA may be aligned with the toggle time point of the data strobe signal DQS and transmitted to the memory controller 400.

In a data (DATA) input operation of the memory device 300, when the data signal DQ including the data DATA is received from the memory controller 400, the memory interface circuitry 310 may receive the data strobe signal DQS, which toggles, along with the data DATA from the memory controller 400. The memory interface circuitry 310 may obtain the data DATA from the data signal DQ based on toggle time points of the data strobe signal DQS. For example, the memory interface circuitry 310 may sample the data signal DQ at rising and falling edges of the data strobe signal DQS and obtain the data DATA.

The memory interface circuitry 310 may transmit a ready/busy output signal nR/B to the memory controller 400 through the eighth pin P18. The memory interface circuitry 310 may transmit state information of the memory device 300 through the ready/busy output signal nR/B to the memory controller 400. When the memory device 300 is in a busy state (i.e., when operations are being performed in the memory device 300), the memory interface circuitry 310 may transmit a ready/busy output signal nR/B indicating the busy state to the memory controller 400. When the memory device 300 is in a ready state (i.e., when operations are not performed or completed in the memory device 300), the memory interface circuitry 310 may transmit a ready/busy output signal nR/B indicating the ready state to the memory controller 400. For example, while the memory device 300 is reading data DATA from the memory cell array 330 in response to a page read command, the memory interface circuitry 310 may transmit a ready/busy output signal nR/B indicating a busy state (e.g., a low level) to the memory controller 400. For example, while the memory device 300 is programming data DATA to the memory cell array 330 in response to a program command, the memory interface circuitry 310 may transmit a ready/busy output signal nR/B indicating the busy state to the memory controller 400.

The control logic circuitry 320 may control all operations of the memory device 300. The control logic circuitry 320 may receive the command/address CMD/ADDR obtained from the memory interface circuitry 310. The control logic circuitry 320 may generate control signals for controlling other components of the memory device 300 in response to the received command/address CMD/ADDR. For example, the control logic circuitry 320 may generate various control signals for programming data DATA to the memory cell array 330 or reading the data DATA from the memory cell array 330.

The memory cell array 330 may store the data DATA obtained from the memory interface circuitry 310, via the control of the control logic circuitry 320. The memory cell array 330 may output the stored data DATA to the memory interface circuitry 310 via the control of the control logic circuitry 320.

The memory cell array 330 may include a plurality of memory cells. For example, the plurality of memory cells may be flash memory cells. However, the inventive concept is not limited thereto, and the memory cells may be RRAM cells, FRAM cells, PRAM cells, thyristor RAM (TRAM) cells, or MRAM cells. Hereinafter, an embodiment in which the memory cells are NAND flash memory cells will mainly be described.

The memory controller 400 may include first to eighth pins P21 to P28 and a controller interface circuitry 410. The first to eighth pins P21 to P28 may respectively correspond to the first to eighth pins P11 to P18 of the memory device 300.

The controller interface circuitry 410 may transmit a chip enable signal nCE to the memory device 300 through the first pin P21. The controller interface circuitry 410 may transmit and receive signals to and from the memory device 300, which is selected by the chip enable signal nCE, through the second to eighth pins P22 to P28.

The controller interface circuitry 410 may transmit the command latch enable signal CLE, the address latch enable signal ALE, and the write enable signal nWE to the memory device 300 through the second to fourth pins P22 to P24. The controller interface circuitry 410 may transmit or receive the data signal DQ to and from the memory device 300 through the seventh pin P27.

The controller interface circuitry 410 may transmit the data signal DQ including the command CMD or the address ADDR to the memory device 300 along with the write enable signal nWE, which toggles. The controller interface circuitry 410 may transmit the data signal DQ including the command CMD to the memory device 300 by transmitting a command latch enable signal CLE having an enable state. Also, the controller interface circuitry 410 may transmit the data signal DQ including the address ADDR to the memory device 300 by transmitting an address latch enable signal ALE having an enable state.

The controller interface circuitry 410 may transmit the read enable signal nRE to the memory device 300 through the fifth pin P25. The controller interface circuitry 410 may receive or transmit the data strobe signal DQS from or to the memory device 300 through the sixth pin P26.

In a data (DATA) output operation of the memory device 300, the controller interface circuitry 410 may generate a read enable signal nRE, which toggles, and transmit the read enable signal nRE to the memory device 300. For example, before outputting data DATA, the controller interface circuitry 410 may generate a read enable signal nRE, which is changed from a static state (e.g., a high level or a low level) to a toggling state. Thus, the memory device 300 may generate a data strobe signal DQS, which toggles, based on the read enable signal nRE. The controller interface circuitry 410 may receive the data signal DQ including the data DATA along with the data strobe signal DQS, which toggles, from the memory device 300. The controller interface circuitry 410 may obtain the data DATA from the data signal DQ based on a toggle time point of the data strobe signal DQS.

In a data (DATA) input operation of the memory device 300, the controller interface circuitry 410 may generate a data strobe signal DQS, which toggles. For example, before transmitting data DATA, the controller interface circuitry 410 may generate a data strobe signal DQS, which is changed from a static state (e.g., a high level or a low level) to a toggling state. The controller interface circuitry 410 may transmit the data signal DQ including the data DATA to the memory device 300 based on toggle time points of the data strobe signal DQS.

The controller interface circuitry 410 may receive a ready/busy output signal nR/B from the memory device 300 through the eighth pin P28. The controller interface circuitry 410 may determine state information of the memory device 300 based on the ready/busy output signal nR/B.

Figure 8:
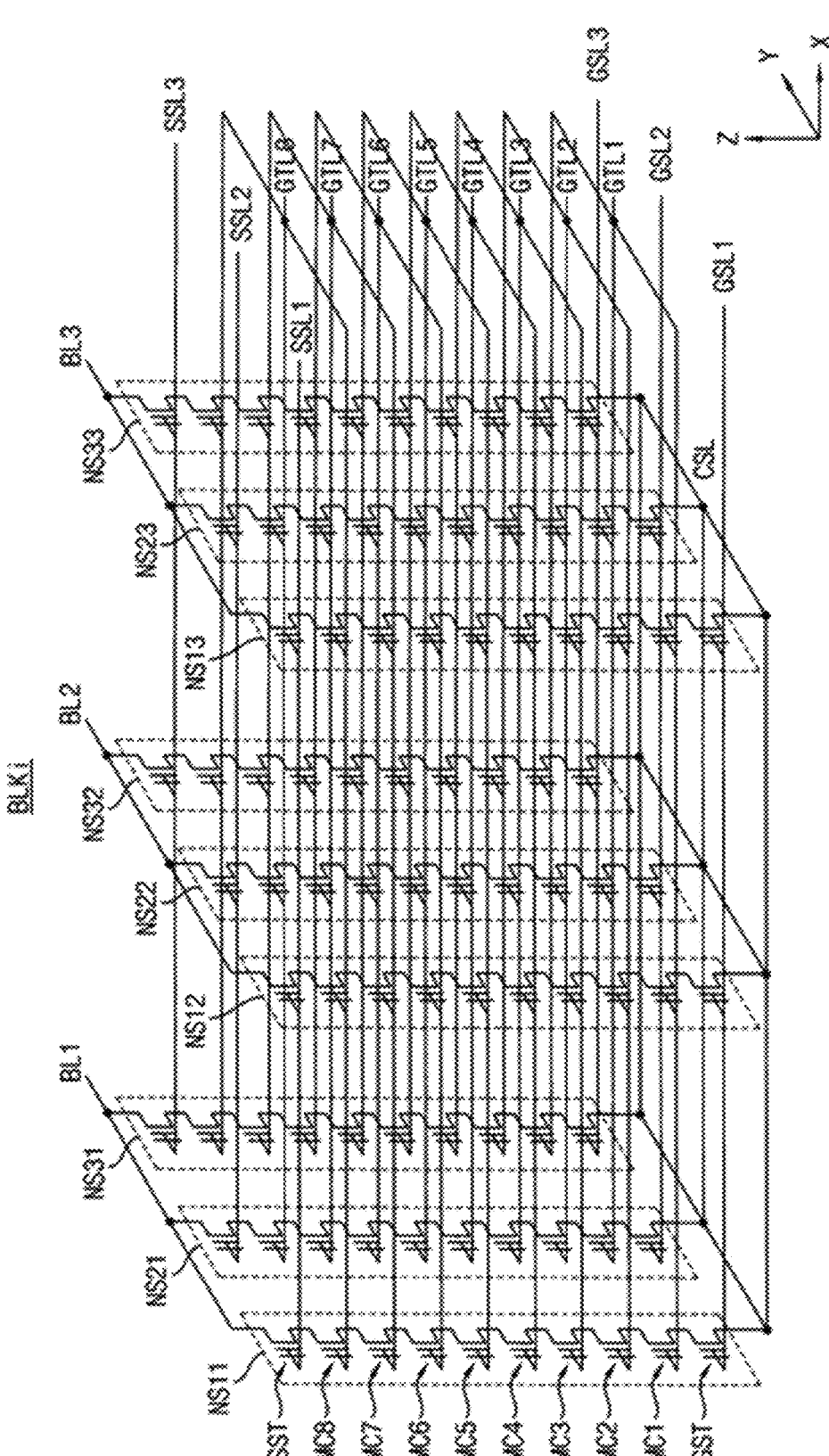
FIG. 8 is a diagram of a 3D V-NAND structure applicable to a UFS device according to an embodiment.

FIG. 8 is a diagram of a 3D V-NAND structure applicable to a UFS device according to an embodiment. When a storage module of the UFS device is implemented as a 3D V-NAND flash memory, each of a plurality of memory blocks included in the storage module may be represented by an equivalent circuit shown in FIG. 8.

A memory block BLKi shown in FIG. 8 may refer to a 3D memory block having a 3D structure formed on a substrate. For example, a plurality of memory NAND strings included in the memory block BLKi may be formed in a vertical direction to the substrate. In embodiments, the vertical direction may correspond to a Z-axis direction illustrated in FIG. 8. In embodiments, the vertical direction may be referred to as a pillar direction.

Referring to FIG. 8, the memory block BLKi may include a plurality of memory NAND strings (e.g., NS11 to NS33), which are connected between bit lines BL1, BL2, and BL3 and a common source line CSL. Each of the memory NAND strings NS11 to NS33 may include a string selection transistor SST, a plurality of memory cells (e.g., MC1, MC2, . . ., and MC8), and a ground selection transistor GST. Each of the memory NAND strings NS11 to NS33 is illustrated as including eight memory cells MC1, MC2, . . ., and MC8 in FIG. 8, without being limited thereto.

The string selection transistor SST may be connected to string selection lines SSL1, SSL2, and SSL3 corresponding thereto. Each of the memory cells MC1, MC2, . . ., and MC8 may be connected to a corresponding one of gate lines GTL1, GTL2, . . ., and GTL8. The gate lines GTL1, GTL2, . . ., and GTL8 may respectively correspond to word lines, and some of the gate lines GTL1, GTL2, . . ., and GTL8 may correspond to dummy word lines. The ground selection transistor GST may be connected to ground selection lines GSL1, GSL2, and GSL3 corresponding thereto. The string selection transistor SST may be connected to the bit lines BL1, BL2, and BL3 corresponding thereto, and the ground selection transistor GST may be connected to the common source line CSL.

Word lines (e.g., WL1) at the same level (e.g., the same row) may be connected in common, and the ground selection lines GSL1, GSL2, and GSL3 and the string selection lines SSL1, SSL2, and SSL3 may be separated from each other. FIG. 8 illustrates a case in which a memory block BLK is connected to eight gate lines GTL1, GTL2, . . ., and GTL8 and three bit lines BL1, BL2, and BL3, without being limited thereto.

Figure 9:
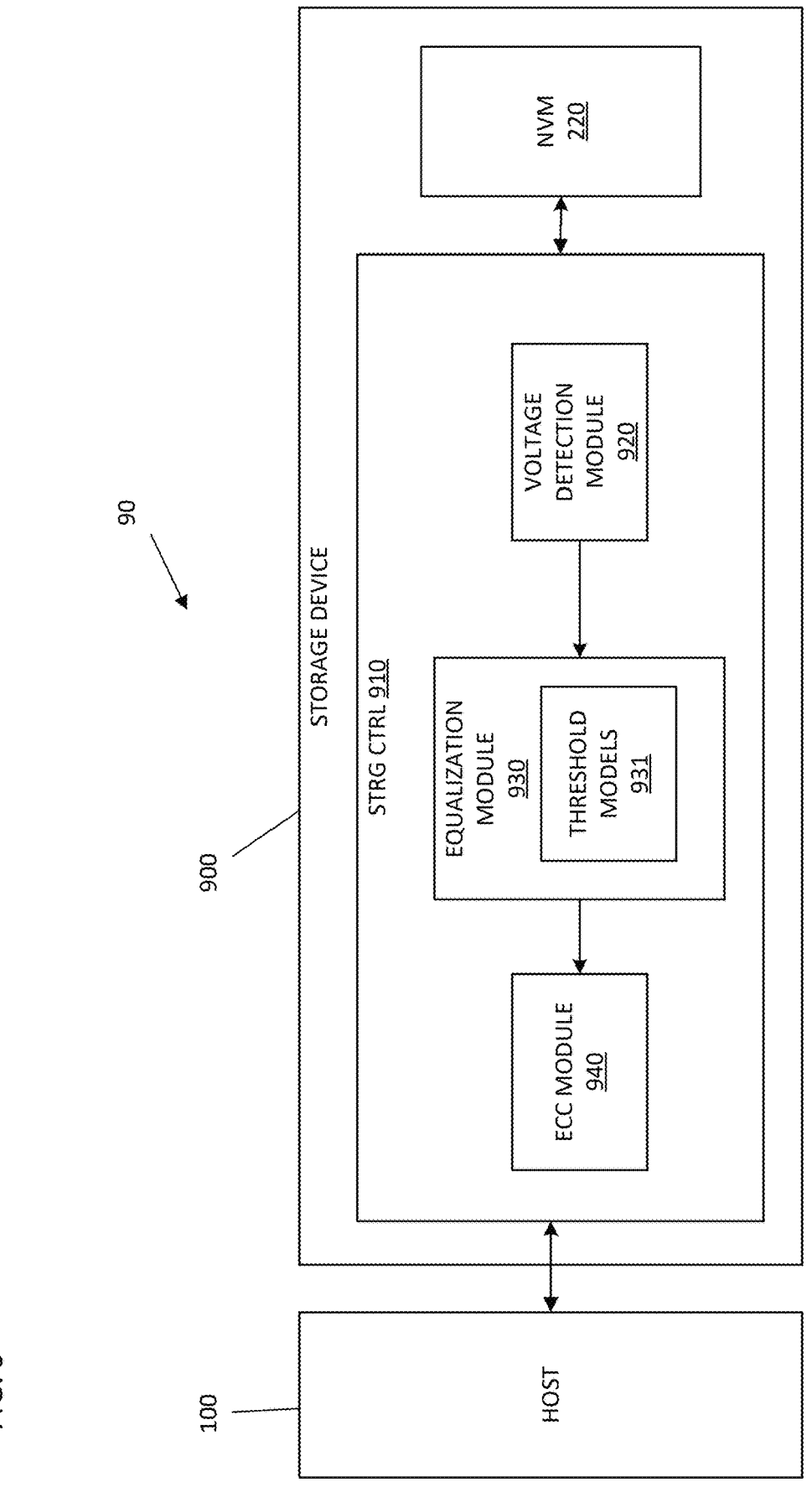
FIG. 9 is a block diagram of a storage system according to embodiments.

FIG. 9 is a block diagram of a storage system according to embodiments. As shown in FIG. 9, the storage system 90 may include a host 100 and storage device 900, which may include a storage controller 910 and an NVM 220. In embodiments, the host 100 and the NVM 220 may correspond to the host 100 and the NVM 220 included in the host storage system 10 discussed above. In addition, the storage controller 910 may include a voltage detection module 920, an equalization module 930 which may include a plurality of threshold models 931, and an ECC module 940. In embodiments, the storage controller 910 may be similar to the storage controller 210 discussed above, and may include one or more elements of the storage controller 210 in addition to, or in combination with, the elements illustrated in FIG. 9. For example, in embodiments the ECC module 940 may correspond to the ECC engine 217, and the voltage detection module may correspond to the memory interface 212, however embodiments are not limited thereto.

In embodiments, the equalization module 930 may be used to perform a correction operation during a reading process to compensate for noise and reduce or eliminate errors caused by noise. In embodiments, the correction operation may be referred to as a de-noising operation or an equalization operation, and may be performed for example before ECC decoding is applied. According to embodiments, the equalization operation may be used to map a voltage read from a memory cell into one of 2N possible values or voltage levels, which may correspond to all possible combinations of the N bits.

In some embodiments, the plurality of threshold models 931 may be used to split the equalization operation into a plurality of single-bit decision problems, by only considering cases in which the voltage read from the memory cell is close to a decision boundary between two voltage levels. In embodiments, the decision boundary may be referred to as a threshold or a voltage threshold. The memory cells corresponding to these cases may be referred to as weak memory cells.

In embodiments, each of the single-bit decision problems may correspond to a threshold model 931 associated with a particular threshold or decision boundary.

In embodiments, the output of each of the threshold models 931 may be a single LLR value, which may be expressed according to Equation 1 below:

$$F_w(X) = \log \frac{P(bit = 0|X)}{P(bit = 1|X)} \qquad \text{Equation 1}$$

In Equation 1, X may denote a feature vector including features corresponding to the memory cell, and $F_w$ may denote a function with parameters w.

For N bits per cell, there may be 2N voltage levels and 2N−1 threshold models 931. In embodiments, the equalization operation may include identifying weak memory cells, determining a corresponding threshold model 931 for each weak cell, and applying the threshold model 931 to voltage read from the weak memory cell to obtain an LLR representing the data read from the weak memory cell.

Figure 10A:
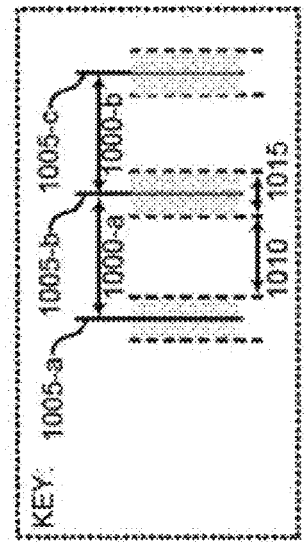
FIG. 10A is a diagram showing examples of voltage thresholds according to embodiments.

FIG. 10A shows an example of voltage thresholds according to embodiments. The example shown includes levels 1000, hard decision voltage thresholds 1005, strong decision voltage ranges 1010, and weak decision voltage ranges 1015.

In the example of FIG. 10A, samples (e.g., read samples, detected voltage samples, etc.) may be passed through a threshold model 931 (e.g., a first threshold model 931-1, a second threshold model 931-2, a sixth threshold model 931-6, etc.) which may be selected from the plurality of threshold models 931 (e.g., by the threshold selection module 932). In embodiments, a threshold model 931 for each sample may be selected (e.g., by the threshold selection module 932) based on characteristics (e.g., a detected value, such as detected voltage) of the sample. For example, a threshold model 931 may be selected (e.g., by the threshold selection module 932) based on a weak decision voltage range 1015 which the sample resides in.

As discussed above, in memory devices such as NVM 220, each memory cell may store N bits of information (where N may be for example 3, 4, or 5) using a single voltage. To read the data stored in the memory device, voltage of each memory cell may be measured, and the voltage level (e.g., Level 0, Level 1, . . . Level 7 illustrated in FIG. 10A) that was stored in the memory cell may be inferred. The data stored in the memory cell, e.g. the three bits stored in a TLC memory cell, may then be recovered.

In embodiments, there may be a tradeoff between the number of voltage levels and the reliability of the memory device. For example, a larger number of bits per memory cell may allow more data to be stored in the memory cell, and therefore may allow more data to be stored in the memory device. However, the voltage levels that represent different values may closer together, because within the same dynamic range, a larger number of distinguishable voltages may be used. Therefore, if noise is present while the memory cell is programmed or read, there may be a larger chance of changing the voltage of a level to another voltage representing a different level, resulting in an error when the memory cell is read. According to embodiments, there may be multiple sources of noise in a memory device which may result in erroneous reading of data from a memory cell, for example write noise, interference noise, device deterioration noise, and read noise. Write noise may refer to changes caused by a writing or programming procedure which may cause the voltage of the memory cell immediately after programming to differ from the intended voltage. Interference noise may refer to changes in the voltage of the memory cell caused by a programming operation performed on a different memory cell, for example a neighboring memory cell. Device deterioration noise may refer to changes in the voltage of the memory cell which increase with the number of times that the memory cell is written to and read from. Read noise may refer to changes or disturbances in the voltage of the memory cell caused by a reading procedure which reads the voltage from the memory cell.

In embodiments, the presence of noise may result in an ambiguous value for the read data (e.g., the read voltage may correspond to a voltage level within a weak decision voltage range 1015 between two hard decision voltage thresholds 1005).

In the example of FIG. 10A, eight voltage levels 1000 are shown (e.g., Level 0, Level 1, . . . Level 7). In embodiments, the eight voltage levels 1000 may be used to represent three bits of data (e.g., a data value of "000" may correspond to Level 0, a data value of "001" may correspond to Level 1, and a data value of "111" may correspond to Level 7. Hard decision thresholds 1005 may be located between two neighboring levels 1000. In addition, strong decision ranges 1010 and weak decision ranges 1015 may be located within a dynamic range from Level 0 to Level 7. Strong decision ranges 1010 may refer to ranges (e.g., voltage ranges) in which the voltage level of a sample may be readily determined (e.g., by the voltage detection module 920). Weak decision ranges 1015 may include ranges surrounding a hard decision threshold 1005, in which the level of a sample may not be readily determined. For example, a weak decision voltage range 1015 may include voltages closely preceding and closely subsequent to hard decision thresholds 1005.

Figure 10A:
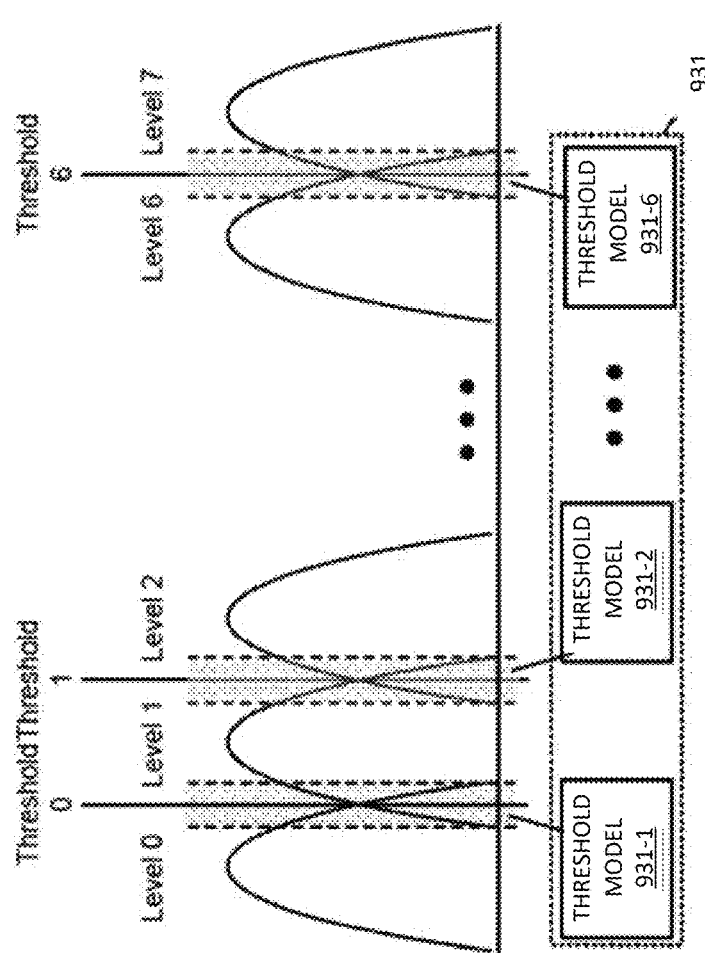

Generally, levels 1000 may be distinguishable based on hard decision thresholds 1005, and levels 1000 may include strong decision ranges 1010 and portions of weak decision ranges 1015. Detected voltages which are determined to be within a strong decision range 1010 may be readily classified as a corresponding level 1000 (e.g., by the voltage detection module 920 without the use the equalization module 930). Detected voltages within a weak decision voltage range 1015 may be used (e.g., by the threshold selection module 932) to select a threshold model 931 which may be used to classify the detected voltage as one of the two neighboring levels 1000. For example, as shown in FIG. 10, a hard decision threshold 1005-b may be located between a level 1000-a and a level 1000-b, and a weak decision voltage range 1015 may include a range between the level 1000-a and the level 1000-b where further analysis on the detected voltage may be performed using a corresponding threshold model 921. In some embodiments, a weak decision voltage range 1015 may include a range in which detected voltages for different values of the channel output may overlap, and the threshold model 931 may be used to classify the detected voltage as one of the two associated neighboring values, for improved accuracy and reliability.

Accordingly, strong samples, or samples within a strong decision range 1010, may have channel output which may be estimated based on the voltage detection module 920 (e.g., without using the equalization module 930), because the strong sample may be within a strong decision range 1010 in which accuracy of the voltage detection module 920 is relatively high. However, weak samples, or samples within a weak decision voltage range 1015, may have channel output estimated by a threshold model 931 selected based on equalization operation associated with the weak decision voltage range 1015 including the detected voltage.

For example, first threshold model 931-1 may be trained based on samples in proximity to hard decision threshold 0, second threshold model 931-2 may be trained based on samples in proximity to hard decision threshold 1, and so on (e.g., though sixth threshold model 931-9 which may be trained based on samples in proximity to hard decision Threshold 6). Each threshold model may be trained to solve a binary classification task associated with the corresponding weak decision voltage range 1015. During inference, each sample may pass through a corresponding one of the threshold models 931.

In an example scenario, the voltage of each sample may be determined (e.g., using the voltage detection module 920). Then, for samples having voltages within a weak decision voltage range 1015, a hard decision may be determined based on the voltage level 1000 which is closest to the determined voltage. Features of the sample may then be provided to the corresponding threshold model 931 (e.g., the threshold model 931 which is trained and configured to perform a classification operation for the weak decision voltage range 1015 associated with the voltage of the sample determined by the voltage detection module 920).

Although FIG. 10A shows an example in which a voltage level is determined or estimation, embodiments are not limited thereto, and in some embodiments other determinations or estimations may be used (e.g., like-bits, soft symbols, etc.). In some embodiments, the number of threshold models 931 may be reduced, for example by using one threshold model 931 to perform classification operations for two weak decision ranges 1015. For example, the first threshold model 925-1 may be used for equalization operations associated with the weak decision voltage range 1015 between Level 0 and Level 1, as well as the weak decision voltage range 1015 between Level 1 and Level 2. As another example, the second threshold model 931-2 may be used for equalization operations associated with the weak decision voltage range 1015 between Level 2 and Level 3, as well as the weak decision voltage range 1015 between Level 3 and Level 4.

Figure 10B:
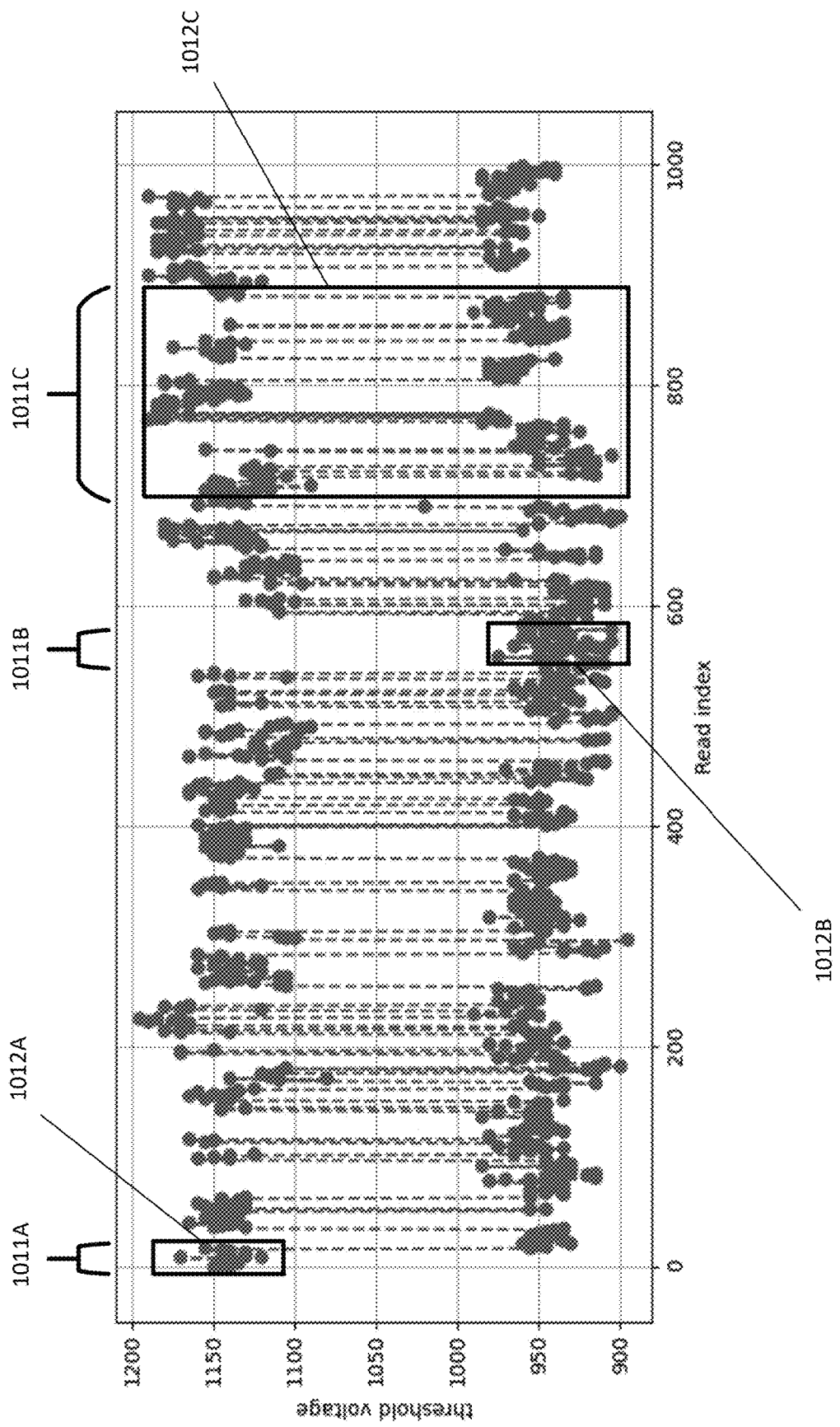
FIG. 10B is a block diagram illustrating the effects of random telegraph noise, according to embodiments.

FIG. 10B is a diagram showing an example of the effects of random telegraph noise (RTN). As discussed above, RTN may refer to an abrupt two-level fluctuation which may occur during a read operation. For example, RTN may be caused by a fluctuation in drain current following trapping and release of a single electron from a poly-silicon trap, but embodiments are not limited thereto. RTN may be a source of noise which reduces the reading accuracy of a memory cell, and may represent a bottleneck for scaling of memory devices such as for NAND flash memory devices.

As shown in FIG. 10B, across one thousand consecutive read operations performed on a single memory cell in which RTN is present, the detected voltages read from the memory cells may be generally grouped into two groups, for example a first group corresponding to voltage levels within approximately 1100 mV to 1200 mV, and a second group having corresponding to voltage levels within approximately 900 mV to 1000 mV. Because the detected voltages may randomly fluctuate between these two groups, it may be difficult to determine the correct threshold voltage level for any particular single read operation. For example, if multiple read operations are performed during a first time period 1011A, the detected voltages 1012A read during this time period may all be included in the first group. As another example, if multiple read operations are performed during a second time period 1011B, the detected voltages 1012B read during this time period may all be included in the second group. However, if multiple read operations are performed during a third time period 1011C, which may be a relatively longer time period, the detected voltages 1012C read during this time period may include detected voltages from both groups, which may allow for correction or reduction in the effects of the RTN.

In order to mitigate errors induced by read noise, and specifically the RTN, for example by correcting or reducing the effects of the RTN, embodiments may perform a plurality of read operations, for example M read operations, on a target memory cell to obtain a plurality of detected voltages which are read from the target memory cell, and may provide these plurality of detected voltages to the threshold model 931. By providing the plurality of detected voltages, the threshold model 931 may better predict or approximate the state of the target memory cell, and therefore raise the probability of correct decoding.

As discussed above, unlike other sources of noise, the RTN may take the form of discrete switching. The transition rate of the RTN, which may refer to the rate at which the detected voltages switch from one group of voltage levels to another group of voltage levels, may vary over wide ranges of values. Therefore, according to embodiments, a delay r may be added between consecutive read operations of the target cells.

Both the number M of the read operations and the delay r between the read operations may be hyperparameters which may be set by a user in order to control the tradeoff between model accuracy and latency. For example, the delay r may be set by the user or the storage controller to be a particular value of time, for example a fraction of a second, one second, ten second, or one hundred seconds, but embodiments are not limited thereto. Larger values of the delay r may increase the probability of an RTN switching event to occur between the read operations. Consequently, the read operations may yield significantly different detected voltages, for example due to the RTN, which may increase the potential of the threshold model 931 to correctly determine the data stored in the target memory cell. In embodiments, all of the plurality of read operations may be performed to correspond to the same weak decision voltage range, but embodiments are not limited thereto.

In some embodiments, the delay r may correspond to a period of time in which the storage controller 910 simply waits, but embodiments are not limited thereto. For example, in some embodiments, the amount of time used by the storage controller to perform two consecutive read operations may allow for a delay r which is sufficient to detect and mitigate the effects of the RTN. As another example, in some embodiments the storage controller 910 may perform a first read operation on the target memory cell to obtain a first detected voltage, and then may provide the first detected voltage to the threshold model 931 to attempt to determine the data. Then, based on a failure to determine the data, for example based on an ECC decoding operation being unsuccessful, the storage controller 910 may perform a second read operation on the target memory cell to obtain a second detected voltage, and may provide both the first detected voltage and the second detected voltage to the threshold model 931. Accordingly, the delay r may correspond to the time between the first read operation and the second read operation during which the storage controller 910 may perform other operations such as attempting to determine the data.

Figure 11:
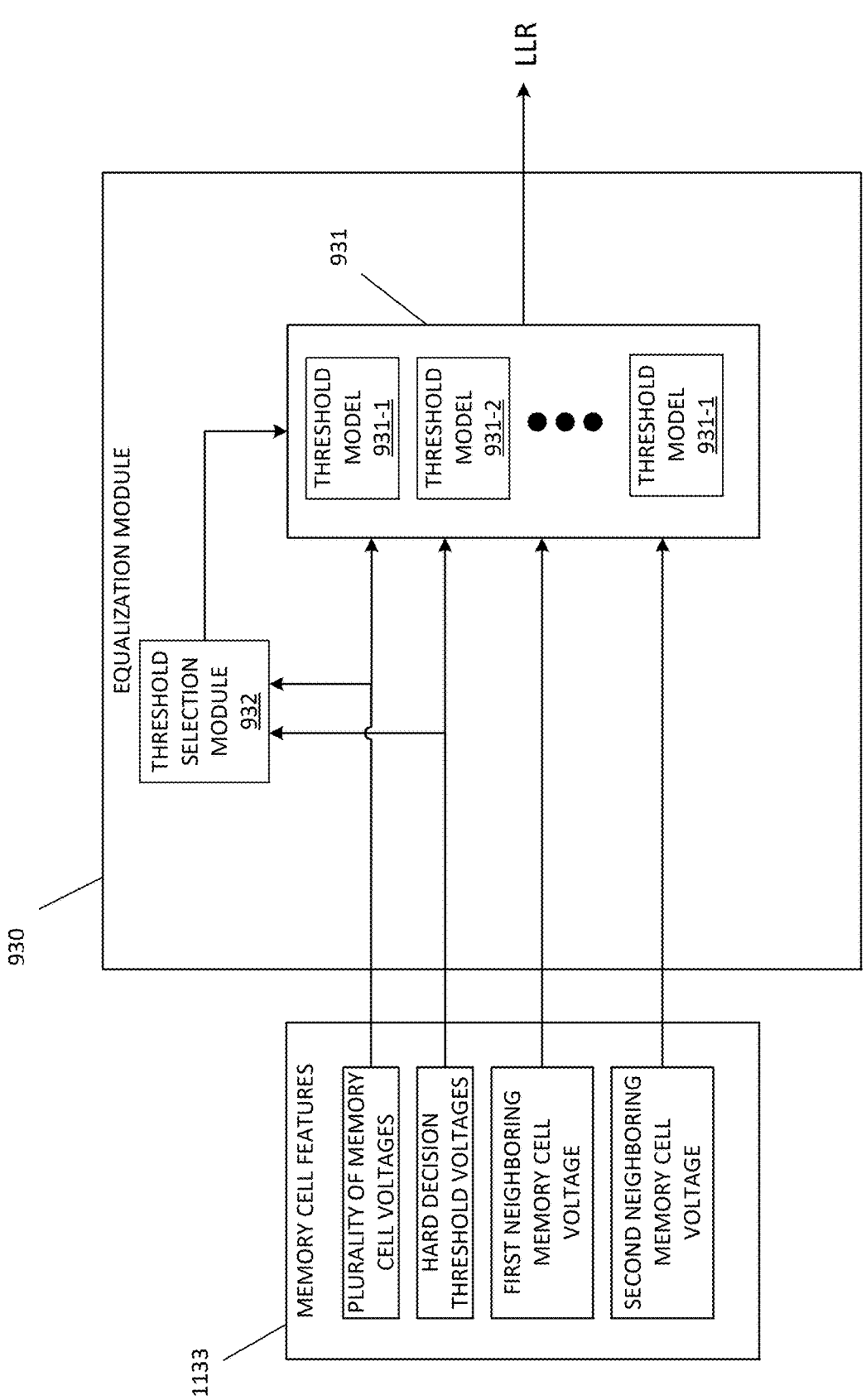
FIG. 11 is a block diagram of an equalization module according to embodiments.

FIG. 11 shows an example of equalization module 930 according embodiments. As shown in FIG. 11, the equalization module 930 may include the plurality of threshold models 931 and a threshold selection module 932. In embodiments, the plurality of threshold models 931 may be, for example, machine-learning models such as neural network models.

In embodiments, a neural network model may refer to a type of computer algorithm capable of learning specific patterns without being explicitly programmed, but through iterations over known data. A neural network model may refer to a cognitive model that includes input nodes, hidden nodes, and output nodes. Nodes in the neural network model may have an activation function that computes whether the node is activated based on the output of previous nodes. Training the system may involve supplying values for the inputs, and modifying edge weights and activation functions (algorithmically or randomly) until the result closely approximates a set of desired outputs.

An artificial neural network model may refer to a hardware or a software component which includes a number of connected nodes (i.e., artificial neurons), which may loosely correspond to the neurons in a human brain. Each connection, or edge, transmits a signal from one node to another (like the physical synapses in a brain). When a node receives a signal, the node processes the signal and then transmits the processed signal to other connected nodes. In some embodiments, the signals between nodes include real numbers, and the output of each node is computed by a function of the sum of its inputs. Each node and edge is associated with one or more node weights that determine how the signal is processed and transmitted. During the training process, these weights are adjusted to improve the accuracy of the result (e.g., by minimizing a loss function which corresponds in some way to the difference between the current result and the target result). The weight of an edge increases or decreases the strength of the signal transmitted between nodes. In some cases, nodes have a threshold below which a signal is not transmitted at all. In some examples, the nodes are aggregated into layers. Different layers perform different transformations on their inputs. The initial layer is known as the input layer and the last layer is known as the output layer. In some cases, signals traverse certain layers multiple times.

In the example of FIG. 11, the equalization module 930 may include the plurality of threshold models 931, which may output soft symbol estimations based on input memory cell features 1133. The input memory cell features 1133 may include the plurality of voltages read from the target memory cell (for example the M detected voltages discussed above), a voltage read from a first neighboring memory cell, for example a memory cell adjacent to the target memory cell in an upward pillar direction, a voltage read from a second neighboring memory cell, for example a memory cell adjacent to the target memory cell in an downward pillar direction, and a reference voltage, for example one or more hard decision voltage thresholds. However, embodiments are not limited thereto.

In the example of FIG. 11, the samples (e.g., the memory cell features 1133) may be passed through at least one of the plurality of threshold models 931, and a soft symbol estimation, for example an LLR value, may be output by the equalization module 930. In embodiments, one or more of the memory cell features 1133, for example the target memory cell voltage and the hard decision voltage thresholds, may be provided to the threshold selection module 932, which may select a threshold model 931 for performing the equalization operation corresponding to the target memory cell.

According to embodiments, the plurality of threshold models 931 may have two competing performance measures: accuracy and complexity cost. Accuracy may refer to the error correcting capability of the storage device 900 including the plurality of threshold models 931. In order to improve the ability of the storage device 900 to correct errors such as bit-flip errors, a larger feature vector and more parameters may be used for the plurality of threshold models 931. Complexity cost may refer to the cost of using the plurality of threshold models 931 in terms of latency and/or gate-count. Larger threshold models 931 may be configured with more computing time (in firmware) or larger gate-count (in hardware) than smaller threshold models 931. According to embodiments, in order increase accuracy of the storage device 900, a complexity cost of the plurality of threshold models 931 may be increased.

According to embodiments, the plurality of threshold models 931 may include a set of shallow machine-learning models that may be operated with low memory usage (e.g., a memory usage which is less than a memory usage of the ECC module 940) and low latency. Shallow models may refer to models which favor reduced complexity cost over accuracy, and therefore may operate based on a relatively small number of parameters and features.

For example, in some embodiments the plurality of threshold models 931 may have $F_w$ as a linear function. In embodiments, the equalization operation performed by storage device 900 as discussed above using the plurality of threshold models 931 having $F_w$ as a linear function may be referred to as a linear equalization operation. In embodiments, the linear equalization operation may refer to the equalization operations performed by the storage device 900 as discussed above. In embodiments, $F_w$ may have 3+M input features, which may be for example the memory cell features 1133 discussed above.

Accordingly, each threshold model 931 may have 4+N parameters (e.g., four weights corresponding to the input features and a bias term) for a total of $5\times(2N-1)$ parameters for the equalization operation. For example, the output of each threshold model 931 may be expressed according to Equation 2 below:

$$F_p\left(x^k\right) = b + \sum_i w_i \cdot x_i^k = p^T x^k \qquad \text{Equation 2}$$

In Equation 2 above, $$x_i^k$$

may denote the $i^{th}$ feature of the kth memory cell, $x^k$ may denote the feature vector of kth memory cell, and the vector of the parameters of the threshold model 931 may be expressed according to Equation 3 below:

$$p = (b \ \ w_1 \ \ w_2 \ \ w_3 \ \ w_4 \ \ \cdots \ \ w_M)^T$$

In some embodiments, the input memory cell features 1133 may include one or more non-linear features. For example, given M detected voltages of the target memory cell, the storage controller 910 may determine a maximum detected voltage and a minimum detected voltage in the M detected voltages, and may provide the maximum detected voltage and the minimum detected voltage as input features to the threshold model 931. However, embodiments are not limited thereto, and in some embodiments the input features to the threshold model 931 may include any other function or embedding of the M detected voltages, for example a mean of the M detected voltages.

In embodiments, each threshold model 931 may be a shallow neural network, and each shallow neural network may be trained and configured for a classification operation for a different hard decision voltage threshold 1005 or a different weak decision range 1015. However, embodiments are not limited thereto, and in some embodiments other types of machine-learning models may be used, for example logistic regression models, decision trees, random forests, etc. In embodiments, the plurality of threshold models 931 may be implemented using firmware, and therefore may be used by any NAND flash memory architectures.

Figure 12A:
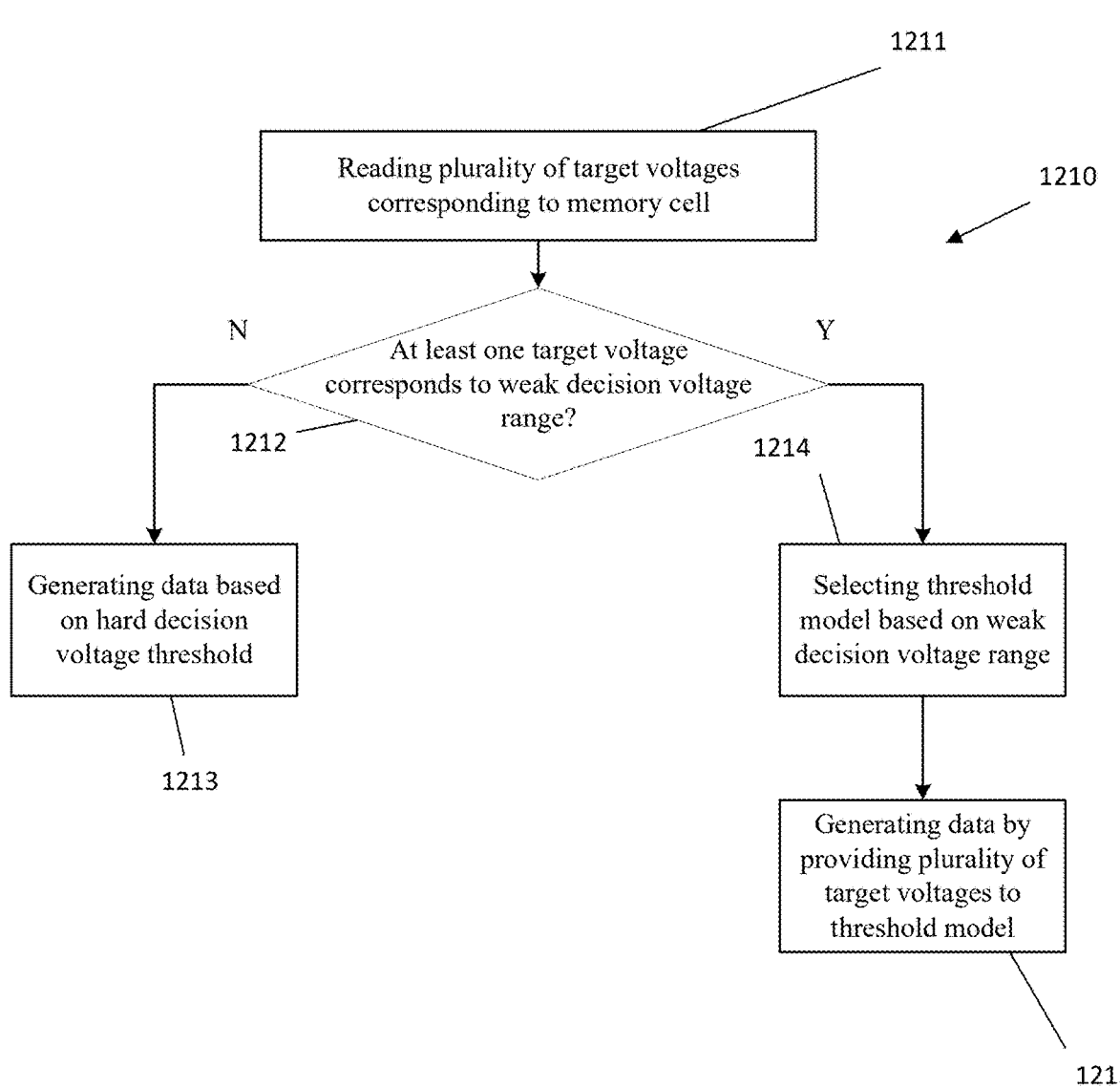

FIG. 12A is a flowchart of a process 1210 of controlling a storage device, according to embodiments. In some implementations, one or more process blocks of FIG. 12A may be performed by any of the elements discussed above, for example one or more of the storage device 900 and any of the elements included therein, for example the storage controller 910, the voltage detection module 920, the equalization module 930, the plurality of threshold models 931, and the ECC module 940. In embodiments, the process 1210 may correspond to the linear equalization operation discussed above.

As shown in FIG. 12A, at operation 1211 the process 1210 may include reading a plurality of voltages corresponding to a target memory cell. For example, in operation 1211 the storage controller 910 may perform a plurality of read operations on the target memory cell to obtain a plurality of detected voltages. In embodiments, the plurality of detected voltages read from the target memory cell may be referred to as a plurality of target voltages. In embodiments, the plurality of target voltages may be read at a plurality of read times which may be separated by the delay r discussed above.

As further shown in FIG. 12A, at operation 1212 the process 1210 may include determining whether at least one of the plurality of target voltages corresponds to a weak decision voltage range. In embodiments, the weak decision voltage range may correspond to one or more of the weak decision voltage ranges 1015 discussed above. Based on determining that the voltage does not correspond to a weak decision voltage range (N at operation 1212), the process 1210 may include generating data corresponding to the memory cell based on a hard decision voltage threshold. Based on determining that the voltage corresponds to a weak decision voltage range (Y at operation 1212), the process 1210 may include selecting a threshold model from among a plurality of threshold models based on the weak decision voltage range. In embodiments, the plurality of threshold models may correspond to the plurality of threshold models 931.

As further shown in FIG. 12A, at operation 1215 the process 1210 may include generating data by providing the plurality of target voltages to the selected threshold model.

FIG. 12B is a flowchart of a process 1220 of controlling a storage device, according to embodiments. In some implementations, one or more process blocks of FIG. 12B may be performed by any of the elements discussed above, for example one or more of the storage device 900 and any of the elements included therein, for example the storage controller 910, the voltage detection module 920, the equalization module 930, the plurality of threshold models 931, and the ECC module 940.

As shown in FIG. 12B, at operation 1221 the process 1220 may include reading a first neighboring voltage. In embodiments, the first neighboring voltage may be read from a first neighboring memory cell, for example, a memory cell which is adjacent to the target memory cell in an upward pillar direction.

As further shown in FIG. 12B, at operation 1222 the process 1220 may include reading a second neighboring voltage. In embodiments, the second neighboring voltage may be read from a first neighboring memory cell, for example, a memory cell which is adjacent to the target memory cell in an upward pillar direction.

As further shown in FIG. 12B, at operation 1223 the process 1220 may include reading first target voltage from the target memory cell.

As further shown in FIG. 12B, at operation 1224 the process 1220 may include, after waiting a predetermined amount of time, reading a second target voltage from the target memory cell.

In embodiments, the reading of the target memory cell may continue for any number of times, for example until M target voltages are read. Accordingly, as further shown in FIG. 12B, at operation 1225 the process 1220 may include, after waiting a predetermined amount of time, reading an $M^{th}$ second target voltage from the target memory cell.

As further shown in FIG. 12B, at operation 1226 the process 1220 may include generating data by providing the first neighboring voltage, the second neighboring voltage, and the M target voltages to the selected threshold model.

In embodiments, operations 1221 through 1225 may correspond to operation 1211 discussed above. In embodiments, the predetermined amount of time discussed above may correspond to the delay r discussed above. In embodiments, as discussed above, the delay r may correspond to a waiting period, but embodiments are not limited thereto. For example, in some embodiments, the amount of time used by the storage controller 910 to perform consecutive read operations may allow for a delay r which is sufficient to detect and mitigate the effects of the RTN. As another example, the delay r may be a time during which the storage controller 910 may perform other operations such as attempting to determine the data.

Although FIGS. 12A and 12B show example blocks of processes 1210 and 1220, in some implementations, the processes 1210 and 1220 may include additional blocks, fewer blocks, different blocks, or differently arranged blocks than those depicted in FIGS. 12A and 12B. Additionally, or alternatively, two or more of the blocks of the processes 1210 and 1220 may be arranged or combined in any order, or performed in parallel.

Figure 13:
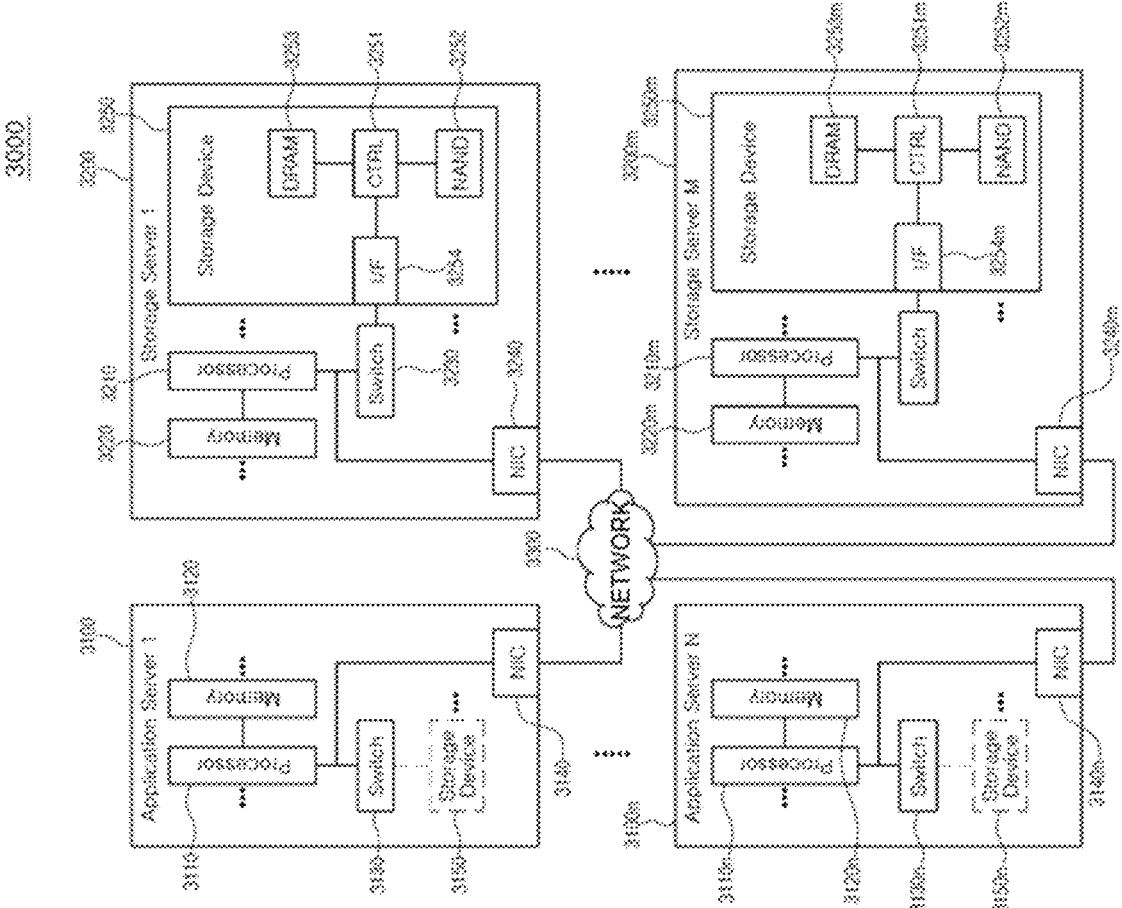
FIG. 13 is a block diagram of data center, according to embodiments.

FIG. 13 is a diagram of a data center 3000 to which a memory device is applied, according to embodiments.

Referring to FIG. 13, the data center 3000 may be a facility that collects various types of pieces of data and provides services and be referred to as a data storage center. The data center 3000 may be a system for operating a search engine and a database, and may be a computing system used by companies, such as banks, or government agencies. The data center 3000 may include application servers 3100 to 3100n and storage servers 3200 to 3200m. The number of application servers 3100 to 3100n and the number of storage servers 3200 to 3200m may be variously selected according to embodiments. The number of application servers 3100 to 3100n may be different from the number of storage servers 3200 to 3200m.

The application server 3100 or the storage server 3200 may include at least one of processors 3110 and 3210 and memories 3120 and 3220. The storage server 3200 will now be described as an example. The processor 3210 may control all operations of the storage server 3200, access the memory 3220, and execute instructions and/or data loaded in the memory 3220. The memory 3220 may be a double-data-rate synchronous DRAM (DDR SDRAM), a high-bandwidth memory (HBM), a hybrid memory cube (HMC), a dual in-line memory module (DIMM), Optane DIMM, and/or a non-volatile DIMM (NVMDIMM). In some embodiments, the numbers of processors 3210 and memories 3220 included in the storage server 3200 may be variously selected. In embodiments, the processor 3210 and the memory 3220 may provide a processor-memory pair. In embodiments, the number of processors 3210 may be different from the number of memories 3220. The processor 3210 may include a single-core processor or a multi-core processor. The above description of the storage server 3200 may be similarly applied to the application server 3100. In some embodiments, the application server 3100 may not include a storage device 3150. The storage server 3200 may include at least one storage device 3250. The number of storage devices 3250 included in the storage server 3200 may be variously selected according to embodiments.

The application servers 3100 to 3100n may communicate with the storage servers 3200 to 3200m through a network 3300. The network 3300 may be implemented by using a fiber channel (FC) or Ethernet. In this case, the FC may be a medium used for relatively high-speed data transmission and use an optical switch with high performance and high availability. The storage servers 3200 to 3200m may be provided as file storages, block storages, or object storages according to an access method of the network 3300.

In embodiments, the network 3300 may be a storage-dedicated network, such as a storage area network (SAN). For example, the SAN may be an FC-SAN, which uses an FC network and is implemented according to an FC protocol (FCP). As another example, the SAN may be an Internet protocol (IP)-SAN, which uses a transmission control protocol (TCP)/IP network and is implemented according to a SCSI over TCP/IP or Internet SCSI (iSCSI) protocol. In another embodiment, the network 3300 may be a general network, such as a TCP/IP network. For example, the network 3300 may be implemented according to a protocol, such as FC over Ethernet (FCoE), network attached storage (NAS), and NVMe over Fabrics (NVMe-oF).

Hereinafter, the application server 3100 and the storage server 3200 will mainly be described. A description of the application server 3100 may be applied to another application server 3100n, and a description of the storage server 3200 may be applied to another storage server 3200m.

The application server 3100 may store data, which is requested by a user or a client to be stored, in one of the storage servers 3200 to 3200m through the network 3300. Also, the application server 3100 may obtain data, which is requested by the user or the client to be read, from one of the storage servers 3200 to 3200m through the network 3300. For example, the application server 3100 may be implemented as a web server or a database management system (DBMS).

The application server 3100 may access a memory 3120n or a storage device 3150n, which is included in another application server 3100n, through the network 3300. Alternatively, the application server 3100 may access memories 3220 to 3220m or storage devices 3250 to 3250m, which are included in the storage servers 3200 to 3200m, through the network 3300. Thus, the application server 3100 may perform various operations on data stored in application servers 3100 to 3100n and/or the storage servers 3200 to 3200m. For example, the application server 3100 may execute an instruction for moving or copying data between the application servers 3100 to 3100n and/or the storage servers 3200 to 3200m. In this case, the data may be moved from the storage devices 3250 to 3250m of the storage servers 3200 to 3200m to the memories 3120 to 3120n of the application servers 3100 to 3100n directly or through the memories 3220 to 3220m of the storage servers 3200 to 3200m. The data moved through the network 3300 may be data encrypted for security or privacy.

The storage server 3200 will now be described as an example. An interface 3254 may provide physical connection between a processor 3210 and a controller 3251 and a physical connection between a network interface card (NIC) 3240 and the controller 3251. For example, the interface 3254 may be implemented using a direct attached storage (DAS) scheme in which the storage device 3250 is directly connected with a dedicated cable. For example, the interface 3254 may be implemented by using various interface schemes, such as ATA, SATA, e-SATA, an SCSI, SAS, PCI, PCIe, NVMe, IEEE 1394, a USB interface, an SD card interface, an MMC interface, an eMMC interface, a UFS interface, an eUFS interface, and/or a CF card interface.

The storage server 3200 may further include a switch 3230 and the NIC (Network InterConnect) 3240. The switch 3230 may selectively connect the processor 3210 to the storage device 3250 or selectively connect the NIC 3240 to the storage device 3250 via the control of the processor 3210.

In embodiments, the NIC 3240 may include a network interface card and a network adaptor. The NIC 3240 may be connected to the network 3300 by a wired interface, a wireless interface, a Bluetooth interface, or an optical interface. The NIC 3240 may include an internal memory, a digital signal processor (DSP), and a host bus interface and be connected to the processor 3210 and/or the switch 3230 through the host bus interface. The host bus interface may be implemented as one of the above-described examples of the interface 3254. In embodiments, the NIC 3240 may be integrated with at least one of the processor 3210, the switch 3230, and the storage device 3250.

In the storage servers 3200 to 3200m or the application servers 3100 to 3100n, a processor may transmit a command to storage devices 3150 to 3150n and 3250 to 3250m or the memories 3120 to 3120n and 3220 to 3220m and program or read data. In this case, the data may be data of which an error is corrected by an ECC engine. The data may be data on which a data bus inversion (DBI) operation or a data masking (DM) operation is performed, and may include cyclic redundancy code (CRC) information. The data may be data encrypted for security or privacy.

Storage devices 3150 to 3150$n$ and 3250 to 3250$m$ may transmit a control signal and a command/address signal to NAND flash memory devices 3252 to 3252$m$ in response to a read command received from the processor. Thus, when data is read from the NAND flash memory devices 3252 to 3252$m$, a read enable (RE) signal may be input as a data output control signal, and thus, the data may be output to a DQ bus. A data strobe signal DQS may be generated using the RE signal. The command and the address signal may be latched in a page buffer depending on a rising edge or falling edge of a write enable (WE) signal.

The controller 3251 may control all operations of the storage device 3250. In embodiments, the controller 3251 may include SRAM. The controller 3251 may write data to the NAND flash memory device 3252 in response to a write command or read data from the NAND flash memory device 3252 in response to a read command. For example, the write command and/or the read command may be provided from the processor 3210 of the storage server 3200, the processor 3210$m$ of another storage server 3200$m$, or the processors 3110 and 3110$n$ of the application servers 3100 and 3100$n$. DRAM 3253 may temporarily store (or buffer) data to be written to the NAND flash memory device 3252 or data read from the NAND flash memory device 3252. Also, the DRAM 3253 may store metadata. Here, the metadata may be user data or data generated by the controller 3251 to manage the NAND flash memory device 3252. The storage device 3250 may include a secure element (SE) for security or privacy.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of certain embodiments and is not to be construed as limiting thereof. Although a few embodiments have been described, those skilled in the art will readily appreciate that many modifications are possible in the embodiments without materially departing from the present scope.

What is claimed is:

1. A storage device, comprising:
   a non-volatile memory comprising a plurality of memory cells, wherein the plurality of memory cells comprise a target memory cell; and
   a storage controller configured to:
   read the target memory cell at a plurality of target read times to obtain a plurality of target voltages,
   select a threshold model corresponding to the target memory cell from among a plurality of threshold models, and
   generate data corresponding to the target memory cell by providing the plurality of target voltages to the threshold model.

2. The storage device of claim 1, wherein each target read time from among the plurality of target read times is separated by a delay.

3. The storage device of claim 1, wherein to read the target memory cell at the plurality of target read times, the storage controller is further configured to:
   read the target memory cell at a first target read time from among the plurality of target read times to obtain a first target voltage from among the plurality of target voltages, and
   after waiting a predetermined amount of time after the first target read time, read the target memory cell at a second target read time from among the plurality of target read times to obtain a second target voltage from among the plurality of target voltages.

4. The storage device of claim 1, wherein each threshold model from among the plurality of threshold models is associated with a corresponding weak decision voltage range from among a plurality of weak decision voltage ranges corresponding to the non-volatile memory.

5. The storage device of claim 4, wherein to generate the data, the storage controller is further configured to:
   determine that at least one target voltage from among the plurality of target voltages corresponds to a weak decision voltage range from among the plurality of weak decision voltage ranges;
   select the threshold model from among the plurality of threshold models based on determining that the threshold model corresponds to the weak decision voltage range; and
   generate the data by providing the plurality of target voltages to the threshold model.

6. The storage device of claim 5, wherein the plurality of memory cells further comprise a first neighboring memory cell adjacent to the target memory cell in an upward pillar direction and a second neighboring memory cell adjacent to the target memory cell in a downward pillar direction, and wherein an input to the threshold model comprises the plurality of target voltages, a first neighboring voltage read from the first neighboring memory cell, a second neighboring voltage read from the second neighboring memory cell, and the weak decision voltage range.

7. The storage device of claim 6, wherein the storage controller is further configured to determine a maximum target voltage and a minimum target voltage from among the plurality of target voltages, and wherein the input to the threshold model further comprises the maximum target voltage and the minimum target voltage.

8. The storage device of claim 6, wherein the storage controller is further configured to determine a mean target voltage from among the plurality of target voltages, and wherein the input to the threshold model further comprises the mean target voltage.

9. A storage controller for controlling a storage device, the storage controller comprising:

at least one processor configured to:

perform a first target read operation on a target memory cell included in a non-volatile memory to obtain a first target voltage, after waiting a predetermined amount of time after the first target read operation, perform a second target read operation on the target memory cell to obtain a second target voltage, select a threshold model corresponding to the target memory cell from among a plurality of threshold models, and generate data corresponding to the target memory cell by providing the first target voltage and the second target voltage to the threshold model.

10. The storage controller of claim 9, wherein each threshold model from among the plurality of threshold models is associated with a corresponding weak decision voltage range from among a plurality of weak decision voltage ranges corresponding to the non-volatile memory.

11. The storage controller of claim 10, wherein to generate the data, the at least one processor is further configured to:

determine that at least one from among the first target voltage and the second target voltage corresponds to a weak decision voltage range from among the plurality of weak decision voltage ranges;

select the threshold model from among the plurality of threshold models based on determining that the threshold model corresponds to the weak decision voltage range; and generate the data by providing the first target voltage and the second target voltage to the threshold model.

12. The storage controller of claim 11, wherein the non-volatile memory further comprises a first neighboring memory cell adjacent to the target memory cell in an upward pillar direction and a second neighboring memory cell adjacent to the target memory cell in a downward pillar direction, wherein the at least one processor is further configured to:

perform a first neighboring read operation on the first neighboring memory cell to obtain a first neighboring voltage, and perform a second neighboring read operation on the second neighboring memory cell to obtain a second neighboring voltage, and wherein an input to the threshold model comprises the first target voltage, the second target voltage, the first neighboring voltage, the second neighboring voltage, and the weak decision voltage range.

13. The storage controller of claim 12, wherein the first target read operation and the second target read operation are included in a plurality of target read operations performed by the at least one processor on the target memory cell to obtain a plurality of target voltages, wherein the storage controller is further configured to determine a maximum target voltage and a minimum target voltage from among the plurality of target voltages, and wherein the input to the threshold model further comprises the maximum target voltage and the minimum target voltage.

14. The storage controller of claim 12, wherein the first target read operation and the second target read operation are included in a plurality of target read operations performed by the at least one processor on the target memory cell to obtain a plurality of target voltages, wherein the storage controller is further configured to determine a mean target voltage from among the plurality of target voltages, and wherein the input to the threshold model further comprises the mean target voltage.

15. A method of reading data stored in a storage device, the method being executed by at least one processor and comprising:

reading a target memory cell at a plurality of target read times to obtain a plurality of target voltages, wherein the target memory cell is included in a plurality of memory cells included in a non-volatile memory of the storage device;

selecting a threshold model corresponding to the target memory cell from among a plurality of threshold models; and generating data corresponding to the target memory cell by providing the plurality of target voltages to the threshold model.

16. The method of claim 15, wherein each target read time from among the plurality of target read times is separated by a delay.

17. The method of claim 15, wherein the reading of the target memory cell at the plurality of target read times comprises:

reading the target memory cell at a first target read time from among the plurality of target read times to obtain a first target voltage from among the plurality of target voltages; and after waiting a predetermined amount of time after the first target read time, reading the target memory cell at a second target read time from among the plurality of target read times to obtain a second target voltage from among the plurality of target voltages.

18. The method of claim 15, wherein each threshold model from among the plurality of threshold models is associated with a corresponding weak decision voltage range from among a plurality of weak decision voltage ranges corresponding to the non-volatile memory.

19. The method of claim 18, wherein the generating the data comprises:

determining that at least one target voltage from among the plurality of target voltages corresponds to a weak decision voltage range from among the plurality of weak decision voltage ranges;

selecting the threshold model from among the plurality of threshold models based on determining that the threshold model corresponds to the weak decision voltage range; and generating the data by providing the plurality of target voltages to the threshold model.

20. The method of claim 19, wherein the plurality of memory cells further comprises a first neighboring memory cell adjacent to the target memory cell in an upward pillar direction and a second neighboring memory cell adjacent to the target memory cell in a downward pillar direction, and wherein an input to the threshold model comprises the plurality of target voltages, a first neighboring voltage read from the first neighboring memory cell, and a second neighboring voltage read from the second neighboring memory cell, and the weak decision voltage range.

\* \* \* \* \*